(12) United States Patent
Clark

(10) Patent No.: US 10,964,608 B2
(45) Date of Patent: *Mar. 30, 2021

(54) PLATFORM AND METHOD OF OPERATING FOR INTEGRATED END-TO-END GATE CONTACT PROCESS

(71) Applicant: Tokyo Electron Limited, Tokyo (JP)

(72) Inventor: Robert Clark, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/356,451

(22) Filed: Mar. 18, 2019

(65) Prior Publication Data

US 2019/0295905 A1  Sep. 26, 2019

Related U.S. Application Data

(60) Provisional application No. 62/645,685, filed on Mar. 20, 2018, provisional application No. 62/794,315, filed on Jan. 18, 2019, provisional application No. 62/787,607, filed on Jan. 2, 2019, provisional application No. 62/787,608, filed on Jan. 2, 2019, provisional application No. 62/788,195, filed on Jan. 4, 2019.

(51) Int. Cl.
*H01L 21/66* (2006.01)
*H01L 21/67* (2006.01)
*H01L 21/285* (2006.01)

(52) U.S. Cl.
CPC ........ *H01L 22/26* (2013.01); *H01L 21/28518* (2013.01); *H01L 21/67196* (2013.01); *H01L 21/67207* (2013.01); *H01L 21/67253* (2013.01)

(58) Field of Classification Search
None
See application file for complete search history.

(56) References Cited

U.S. PATENT DOCUMENTS

| | | |
|---|---|---|
| 6,634,845 B1 | 10/2003 | Komino |
| 2004/0162692 A1 | 8/2004 | Ye et al. |
| 2008/0155442 A1 | 6/2008 | Pannese et al. |

(Continued)

OTHER PUBLICATIONS

International Search Report and Written Opinion dated Jul. 3, 2019 in International Application No. PCT/US2019/022716, citing documents AA-AE, 14 pages.

*Primary Examiner* — Angel Roman
(74) *Attorney, Agent, or Firm* — Oblon, McClelland, Maier & Neustadt, L.L.P.

(57) ABSTRACT

A method is provided for gate contact formation on a semiconductor workpiece using an integrated sequence of processing steps executed on a common manufacturing platform (CMP) hosting one or more film-forming modules, one or more etching modules, and one or more transfer modules. A workpiece having a contact feature formed therein, and inspected throughout, the contact feature having a semiconductor contact surface exposed, is received into the CMP. A plurality of metal layers is deposited at a bottom of the contact feature after the workpiece is treated to remove contamination. The integrated sequence of processing steps is executed within the CMP without leaving the controlled environment, the transfer modules used to transfer the workpiece between the modules while maintaining the workpiece within the controlled environment.

19 Claims, 12 Drawing Sheets

(56) References Cited

U.S. PATENT DOCUMENTS

| | | |
|---|---|---|
| 2009/0166752 A1 | 7/2009 | Li |
| 2009/0301525 A1* | 12/2009 | Ozawa .................... C23C 16/54 |
| | | 134/21 |
| 2011/0307089 A1* | 12/2011 | Tomoyasu ............. C25D 11/02 |
| | | 700/103 |
| 2013/0224950 A1 | 8/2013 | Russell et al. |

* cited by examiner

PLATFORM AND METHOD OF OPERATING FOR INTEGRATED END-TO-END GATE CONTACT PROCESS

CROSS-REFERENCE TO RELATED APPLICATIONS

The present application claims the benefit of U.S. Provisional Application No. 62/645,685, filed on Mar. 20, 2018, entitled "Substrate Processing Tool with Integrated Metrology and Method of Using," U.S. Provisional Application No. 62/794,315, filed on Jan. 18, 2019 entitled "Platform and Method for Operating for Integrated End-to-End Gate Contact Process," U.S. Provisional Application No. 62/787,607, filed on Jan. 2, 2019, entitled "Self-Aware and Correcting Heterogeneous Platform incorporating Integrated Semiconductor Processing Modules and Method for using same," U.S. Provisional Application No. 62/787,608, filed on Jan. 2, 2019, entitled "Self-Aware and Correcting Heterogeneous Platform incorporating Integrated Semiconductor Processing Modules and Method for using same," and U.S. Provisional Application No. 62/788,195, filed on Jan. 4, 2019, entitled "Substrate Processing Tool with Integrated Metrology and Method of using," which is incorporated herein by reference in its entirety.

BACKGROUND OF THE INVENTION

Field of the Invention

The present invention relates to a processing platform and methods for semiconductor processing using the platform, and more particularly to a method for forming a gate contact.

Background of the Invention

As the integration density of semiconductor devices continues to increase and the critical dimensions associated with such devices continue to decrease, there has been a corresponding increase in interest in identifying materials and processes for producing low resistance materials that maintain or reduce signal delay. Silicide and salicide (self-aligned silicide) materials and processes have been widely used to lower the sheet resistance and contact resistance for the gate conductor and source/drain regions of MOS devices.

As devices are scaled to smaller and smaller features and techniques are implemented to try and address the issues that result from scaling, it is important to monitor the fabrication process at various stages of the process flow to determine whether the feature attributes are within specification, and if not, to adjust the process to either bring the workpiece within specification or to bring subsequently processed workpieces within specification.

In conventional gate contact formation, the process is performed using multiple separate stand-alone tools for high-volume manufacturing. Wafers are sequentially loaded into one tool, subjected to one process step in that tool, then removed to ambient environment and placed in queue to be loaded into the next tool, and so on until the multiple steps of the gate contact flow are complete. Time spent waiting in queue for each tool is referred to as Q-time, and high Q-times result in lower production rates. Different operations in the process flow may take different amounts of time such that throughput matching of tools is a production challenge.

Each tool in the process flow may be part of a tool cluster. For example, five identical etch tools can be clustered in combination with a transfer tool so that 5 wafers can be etched concurrently at one step of the process flow to enable high-volume production. The multiplicity of these cluster tools provides a benefit if a tool goes out of service for any reason. If 1 tool in a 5-tool cluster goes out of service for 1 week, then production can continue, albeit at only 80% capacity. Thus, each stand-alone tool in the gate contact flow may be a cluster of identical tools to prevent an out of service tool from shutting down production completely, and clustering may be used to minimize throughput matching challenges.

In conventional gate contact formation, if measurements are needed to determine whether the process is operating within specification, a stand-alone metrology tool may be included, where a workpiece is periodically removed from the process flow for measurements to be taken, which are often destructive measurements using a measurement pad on the workpiece, and the results can be fed back to the process flow tools for adjustments to downstream steps in the process flow, or adjustments to upstream steps for future wafers. This process involves exposure to the ambient environment, Q-time waiting for the metrology tool to be available, and lengthy measurement times for results to be obtained, such that significant time may pass before data is available to enable adjustments to be made to the process flow in either a feed-back or feed-forward manner. While real-time measurements of workpiece attributes taken in the process chamber would be ideal, exposure of the measurement devices to process gases is problematic, making real-time, in situ measurement and control logistically difficult or impossible.

Thus, the conventional approach of using multiple separate stand-alone tools (single or clustered) for high-volume manufacturing can lead to issues including but not limited to Q-time oxidation (i.e., as the wafers sit between tools waiting for their turn in the next tool, they can be subjected to oxidation from the ambient environment), defectivity from environmental exposure between tools, cost challenges due to throughput matching difficulties, temporal tool drift (e.g., EPE), real time chamber matching (e.g., yield and EPE), and lack of real-time workpiece measurement and process control. There is a need to address these and other issues to enable high-volume manufacturing with gate contact formation techniques.

SUMMARY OF THE INVENTION

According to embodiments, a method of forming a gate contact on a semiconductor workpiece is provided using an integrated sequence of processing steps executed on a common manufacturing platform hosting a plurality of processing modules including one or more film-forming modules, one or more etching modules, and one or more transfer modules. In one embodiment, the integrated sequence of processing steps includes receiving a workpiece into the common manufacturing platform, the workpiece having a contact feature formed therein, the contact feature having a semiconductor contact surface exposed at a bottom of the contact feature, the semiconductor contact surface containing silicon, or germanium, or an alloy thereof, and treating the semiconductor contact surface in one of the one or more etching modules to remove contamination therefrom. The integrated sequence of processing steps further includes depositing a metal layer within the contact feature in one of the one or more film-forming modules and optionally, applying a conductive capping layer on the deposited metal layer in one of the one or more film-forming modules. Subsequently, the integrated sequence of processing steps includes forming a metal silicide and/or germanide layer by reaction of at least a portion of the deposited metal layer with the semiconductor contact surface. Also, the integrated sequence of processing steps includes inspecting the workpiece before and/or after any one of the treating, depositing, applying, and forming steps to measure one or more attributes of the workpiece, determine whether the measured one or more attributes meet target specifications, and when an excursion from target specifications occurs, take corrective action before, during, or after any one of the treating, depositing, applying, and forming steps. The integrated sequence of processing steps is executed in a controlled environment within the common manufacturing platform and without leaving the controlled environment, and wherein the one or more transfer modules are used to transfer the workpiece between the plurality of processing modules while maintaining the workpiece within the controlled environment.

In a related embodiment, the depositing of a metal layer in the integrated sequence of processing steps may further comprise applying a self-assembled monolayer on an adjacent topography to the contact feature and on sidewall surfaces of the contact feature, selectively depositing a plurality of metal layers on the semiconductor contact surface at the bottom of the contact feature, and removing the self-assembled monolayer exposed on the adjacent topography and sidewall surfaces.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1A:
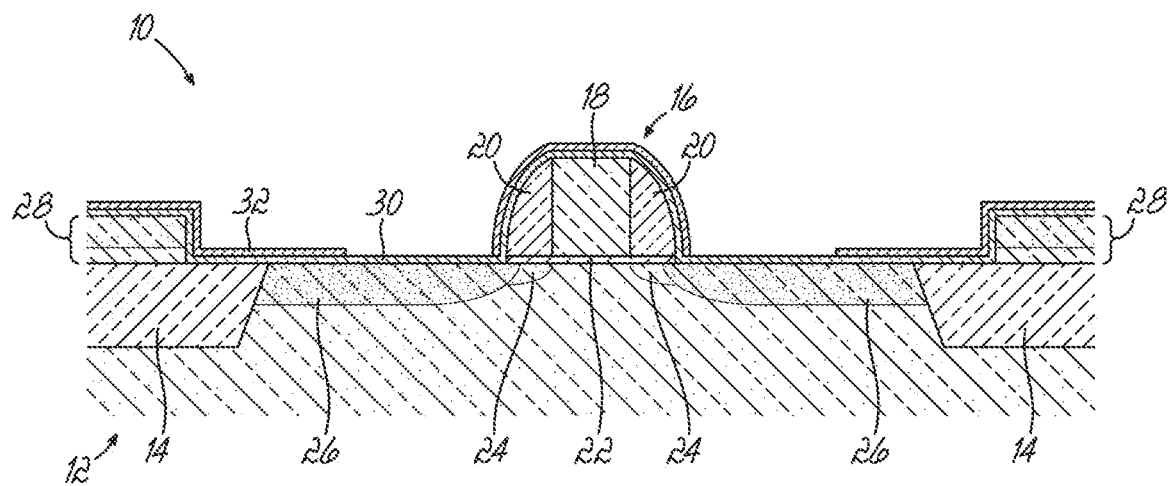
FIGS. 1A-1F are schematic cross-sectional diagrams illustrating one embodiment of a gate contact formation method.

Methods using an integrated platform for gate contact formation are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention but does not denote that it is present in every embodiment. Thus, the phrases such as "in one embodiment" or "in an embodiment" that may appear in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein the term "workpiece" means a composition of materials or layers formed on a substrate during one or more phases of a semiconductor device manufacturing process, the workpiece ultimately comprising the semiconductor device at a final stage of processing.

The present embodiments include methods for gate contact formation that utilize a common manufacturing platform in which multiple process steps are performed on the common platform within a controlled environment, for example, without breaking vacuum between operations. The integrated end-to-end platform may include etching modules, film-forming modules, and annealing modules and is configured to transfer a workpiece from one module to another while maintaining the workpiece in a controlled environment, e.g., without breaking vacuum or leaving an inert gas protective environment, and thus avoiding exposure to an ambient environment. Any gate contact formation process may be carried out on the common manufacturing platform, and the integrated end-to-end platform will enable high-volume manufacturing at reduced cost with improvement to yield, defectivity levels and EPE.

As used herein, an "etching module" refers to any type of processing tool for removing all or a portion of a film, layer, residue or contaminant on a workpiece in a process chamber. The etching module may be a single wafer tool, a batch processing tool, or a semi-batch processing tool. The types of etching that may be performed in the etching module include, by way of example and not limitation, chemical oxide removal (COR), dry (plasma) etching, reactive ion etching, wet etching using immersion or non-immersion techniques, atomic layer etching, chemical-mechanical polishing, cleaning, ashing, lithography, etc., and the process may be isotropic, anisotropic, selective, etc.

As used herein, a "film-forming module" refers to any type of processing tool for depositing or growing a film or layer on a workpiece in a process chamber. The film-forming module may be a single wafer tool, a batch processing tool, or a semi-batch processing tool. The types of film deposition or growth that may be performed in the film-forming module include, by way of example and not limitation, chemical vapor deposition, plasma-enhanced or plasma-assisted chemical vapor deposition, atomic layer deposition, physical vapor deposition, thermal oxidation or nitridation, elevated temperature deposition, etc., and the process may be isotropic, anisotropic, conformal, selective, blanket, etc.

As used herein, an "annealing module" refers to any type of processing tool for applying a thermal treatment to a workpiece in a process chamber. The annealing module may be a single wafer tool, a batch processing tool, or a semi-batch processing tool. The types of thermal treatment processes that may be performed in the annealing module include, by way of example and not limitation, rapid thermal annealing (RTP), flash lamp annealing, laser annealing, or a process performed in a furnace.

As used herein, "module" generally refers to a processing tool with all of its hardware and software collectively, including the process chamber, substrate holder and movement mechanisms, gas supply and distribution systems, pumping systems, electrical systems and controllers, etc. Such details of the modules are known in the art and therefore not discussed herein.

"Controlled environment" as used herein refers to an environment in which the ambient atmosphere is evacuated and either replaced with a purified inert gas or a low-pressure vacuum environment. A vacuum environment is well below atmospheric pressure and is generally understood to be $10^{-5}$ Torr or less, for example $5 \times 10^{-8}$ Torr or less. However, the controlled environment may include any sub-atmospheric pressure environment within the processing tool that is isolated from ambient air conditions or environments greater than atmospheric pressure. Further, the controlled environment within the processing tool is not required to be a constant pressure, or the same pressure, within each portion of the processing tool. For example, pressure within the controlled environment may vary within each chamber of the processing tool at different times to enable different processing conditions within a respective chamber or minimize pressure differentials between two or more chambers when substrates are transferred between chambers.

In its broadest terms, embodiments of the disclosure relate to an integrated sequence of processing steps performed on a workpiece and executed on a common manufacturing platform hosting a plurality of processing modules including one or more film-forming modules, one or more etching modules, and one or more transfer modules. The integrated sequence of processing steps includes receiving a workpiece into the common manufacturing platform, the workpiece having a contact feature formed therein, the contact feature having a semiconductor contact surface exposed at a bottom of the contact feature, the semiconductor contact surface containing silicon, or germanium, or an alloy thereof. Using the one or more etching modules, the semiconductor contact surface is treated to remove contamination therefrom. Then, using the one or more film-forming modules, a metal-containing layer is deposited within the contact feature. Afterwards, using the one or more film-forming modules, an optional conductive capping layer is applied on the deposited metal-containing layer. Subsequently, at least a portion of the deposited metal-containing layer is reacted with the semiconductor contact surface to form a metal silicide and/or germanide layer. In addition, the workpiece is inspected before and/or after any one of the treating, depositing, applying, and forming steps to measure one or more attributes of the workpiece, determine whether the measured one or more attributes meet target specifications, and when an excursion from target specifications occurs, take corrective action before, during, or after any one of the treating, depositing, applying, and forming steps. Further, the integrated sequence of processing steps is executed in a controlled environment within the common manufacturing platform and without leaving the controlled environment, and the one or more transfer modules are used to transfer the workpiece between the plurality of processing modules while maintaining the workpiece within the controlled environment.

Embodiments may include different methods of depositing the metal-containing layer within the contact feature, and therefore on top of the semiconductor contact surface. Thus, the integrated sequence of processing steps may be directed to a patterned mask approach to metal deposition or an area-selective deposition (ASD) approach to metal deposition.

In addition, embodiments may include layers and surfaces that are composed from a variety of materials. The metal-containing layers may include, by way of example and not limitation, Cu, Al, Ta, Ti, W, Ru, Co, Ni, or Mo. The semiconductor contact surface may include, by way of example and not limitation, silicon, polysilicon, or silicon germanium. Additionally, the optional conductive capping layer may include, by way of example and not limitation, TiN, or TaN. Layers composed of dielectric material may include, by way of example and not limitation, Sift, a low-k dielectric material, or a high-k dielectric material. Low-k dielectric materials have a nominal dielectric constant less than the dielectric constant of $SiO_2$, which is approximately 4 (e.g., the dielectric constant for thermally grown silicon dioxide can range from 3.8 to 3.9). High-k materials have a nominal dielectric constant greater than the dielectric constant of Sift.

Low-k dielectric materials may have a dielectric constant of less than 3.7, or a dielectric constant ranging from 1.6 to 3.7. Low-k dielectric materials can include fluorinated silicon glass (FSG), carbon doped oxide, a polymer, a SiCOH-containing low-k material, a non-porous low-k material, a porous low-k material, a spin-on dielectric (SOD) low-k material, or any other suitable dielectric material. The low-k dielectric material can include BLACK DIAMOND® (BD) or BLACK DIAMOND® II (BDII) SiCOH material, commercially available from Applied Materials, Inc., or Coral® CVD films commercially available from Novellus Systems, Inc. Other commercially available carbon-containing materials include SILK® (e.g., SiLK-I, SiLK-J, SiLK-H, SiLK-D, and porous SiLK semiconductor dielectric resins) and CYCLOTENE® (benzocyclobutene) available from Dow Chemical, and GX-3™ and GX-3P™ semiconductor dielectric resins available from Honeywell.

Low-k dielectric materials include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

In addition, low-k materials include a silicate-based material, such as hydrogen silsesquioxane (HSQ) or methyl silsesquioxane (MSQ), deposited using SOD techniques. Examples of such films include FOx® HSQ commercially available from Dow Corning, XLK porous HSQ commercially available from Dow Corning, and JSR LKD-5109 commercially available from JSR Microelectronics.

Embodiments of the invention address integrated gate contact formation processing and the need for performing substrate metrology during the integrated gate contact formation processing. During the processing, substrate metrology may be performed within the common manufacturing platform following any deposition, etching, or annealing module. In one example, substrate metrology is performed following the metal layer deposition step to measure and characterize layer properties and, based on substrate metrology data, perform remedial actions on the metal layer such as increasing or decreasing the thickness of the metal layer. In another example, substrate metrology is performed following the formation of the metal silicide and/or germanide layer to measure and characterize layer properties and, based on substrate metrology data, perform remedial actions on the layer such as applying additional heat. Further, artificial intelligence (AI) may be used to analyze the substrate metrology results and predict future layer properties.

Reference is now made to the drawings, where like reference numerals designate identical or corresponding parts throughout the several views.

FIGS. 1A-1F schematically depict embodiments of a gate contact formation method in which a patterned mask layer is used. In FIG. 1A, the semiconductor workpiece, generally referred to as pattern mask workpiece 10, comprises a silicon-containing substrate 12 having a gate structure 16 formed thereon and therein. The substrate 12 may comprise single crystal silicon, poly-crystalline silicon, silicon-germanium ($SiGe_x$), silicon-carbon ($SiC_y$), or silicon-germanium-carbon ($SiGe_xC_y$), or any combination of two or more thereof, and wherein x and y are greater than or equal to 0. The gate structure 16 includes a gate electrode 18, a gate insulation layer 22, and a gate spacer layer 20. The gate electrode 18 may include one or more layers including, for example, one or more metal layers, one or more metal barrier layers, one or more doped poly-crystalline silicon layers, and one or more cap layers. The gate insulation layer 22 may include, for example, a conventional gate dielectric, such as silicon dioxide ($SiO_2$), or a high dielectric constant (high-k) dielectric layer. The gate spacer layer 20 may comprise one or more material layers, including, for example, silicon oxide ($SiO_2$, or $SiO_x$) and/or silicon nitride ($Si_3N_4$, or $SiN_y$), or any combination of two or more thereof, and wherein x and y are greater than or equal to 0, and is generally formed on the sidewalls of the gate electrode 18.

Also shown in FIG. 1A, the gate structure 16 further includes lightly-doped regions 24 and source/drain regions 26 formed in a surface region of the silicon-containing substrate 12 using ion implant and/or GCIB infusion processes. Isolation regions 14 having silicide blocking layers 28 may be formed adjacent the source/drain regions 26 to define the active region of substrate 12 therebetween. A contact dielectric film 30 may be applied across the top surface of pattern mask workpiece 10, adjacent blocking layers 28, isolation regions 14, source/drain regions 26, and gate structure 16. Additionally, a patterned mask 32 may be applied adjacent the contact dielectric film 30, exposing a portion of the film 30. In alternative embodiments, the patterned masked 32 may expose multiple portions of the film 30.

Figure 1B:
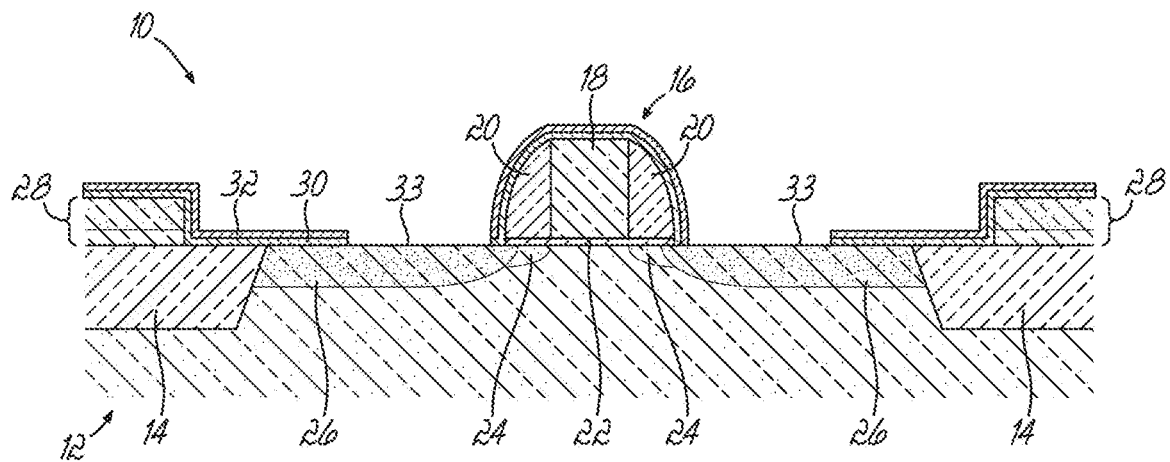

As shown in FIG. 1B, a portion of a source/drain region 26 is exposed, hereinafter referred to as a semiconductor contact surface 33. The positioning of the patterned mask 32 adjacent to the contact dielectric film 30 exposes the portion of the contact dielectric film 30 that is to be removed. Removal may then be performed by an etching process, such as a dry etching process, revealing the semiconductor contact surface 33. In alternative embodiments, multiple semiconductor contact surfaces 33 may be revealed by using a patterned mask 32 with multiple points of exposure. For example, a semiconductor contact surface 33 may be revealed adjacent to each source/drain region 26 present on substrate 12, the invention herein being applied to each semiconductor contact surface. However, for purposes of explanation, the invention is described using a single semiconductor contact surface 33.

Additionally, alternative embodiments of the invention may begin with the semiconductor contact surface 33 already exposed on pattern mask workpiece 10. In these embodiments, FIG. 1B would serve as a representation of the starting point for the processing of pattern mask workpiece 10.

Figure 1C:
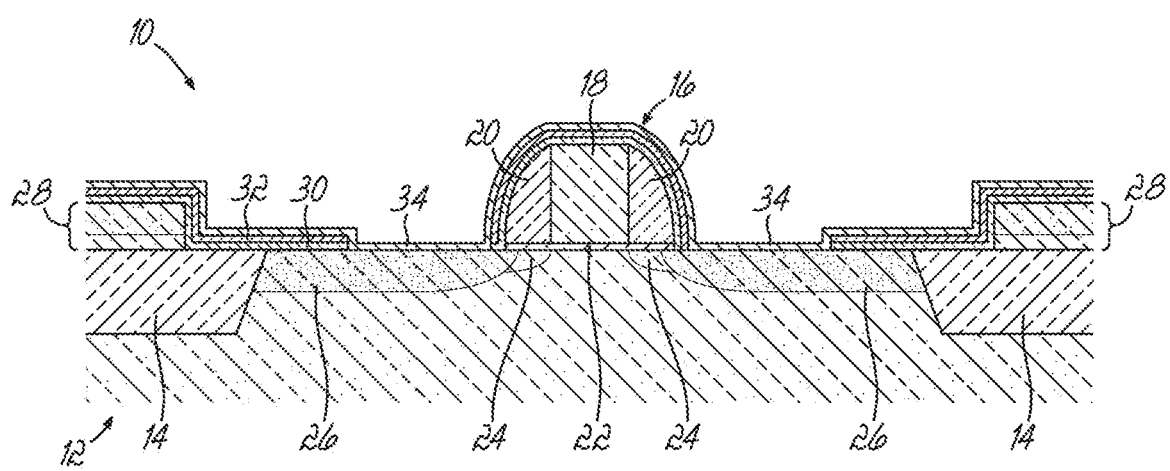

As shown in FIG. 1C, a metal-containing layer 34 is deposited over substrate 12, including over the patterned mask 32 and the semiconductor contact surface 33. The metal-containing layer 34 may comprise cobalt, nickel, titanium, hafnium, platinum, palladium, vanadium, niobium, tungsten, tantalum, zirconium or any alloy thereof. For example, the metal-containing layer 34 may comprise titanium or an alloy thereof. The metal-containing layer 34 may be deposited using a vapor deposition process, such as a physical vapor deposition (PVD) process or variations thereof, a chemical vapor deposition (CVD) process or variations thereof, or an atomic layer deposition (ALD) process or variations thereof. For example, nickel or a nickel alloy may be deposited using a PVD process, or titanium or a titanium alloy may be deposited using CVD or ALD. Prior to depositing the metal-containing layer 34, the substrate 12 may be cleaned using a dry cleaning process to, for example, remove native oxide from the semiconductor contact surface 33.

Figure 1D:
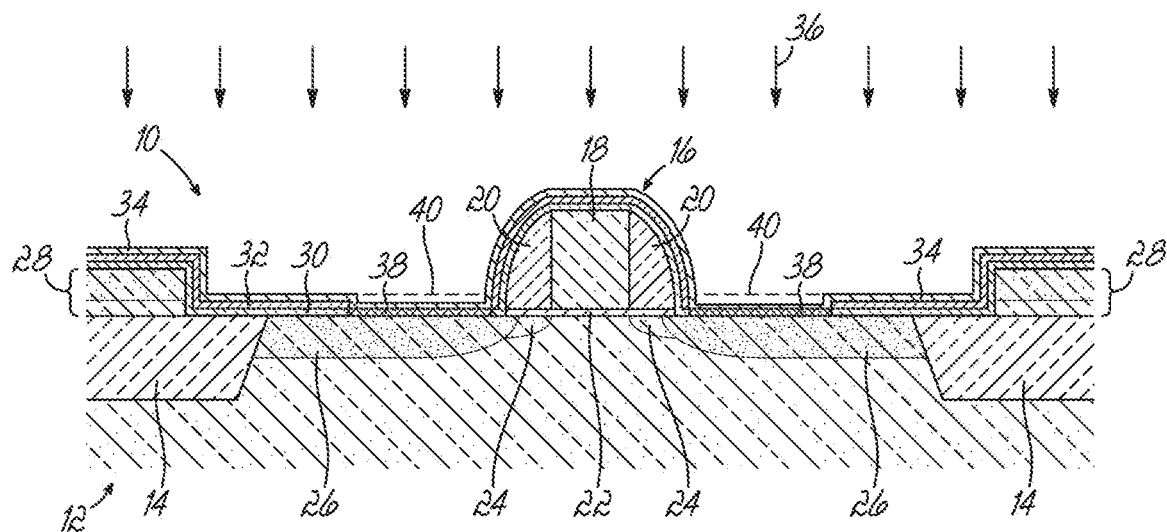

Following the deposition of the metal-containing layer 34, as shown in FIG. 1D, or concurrently with deposition of the metal-containing layer 34, a portion of the metal-containing layer 34 is reacted with an underlying portion of substrate 12 to form a metal-dielectric alloy 38. Examples of the metal-dielectric alloy 38 include, without limitation, metal silicide or germanide. Specifically, in the embodiment shown, the portion of the substrate 12 that underlies the metal-containing layer 34 is the semiconductor contact surface 33, or source/drain region 26 more generally. The reaction between the metal-containing layer 34 and the substrate 12 may proceed following deposition, for example using a thermal process 36, such as a thermal anneal process, or may proceed during deposition of the metal-containing layer 34, for example using a thermal deposition process at a temperature sufficient to activate a reaction between the metal and silicon (not shown). An un-reacted portion of the metal-containing layer 34 may remain, particularly on the patterned mask 32 and the formed metal-dielectric alloy 38. The metal-containing layer 34 over the semiconductor contact surface 33 may be completely converted to a metal-dielectric alloy (illustrated in FIG. 1E and FIG. 1F), or a bottom portion of the metal-containing layer 34 may be converted, while a thinner layer of the metal-containing layer 34 remains over the converted bottom portion (illustrated in FIG. 1D).

Optionally, a conductive capping layer 40 is applied on the metal-containing layer 34. The conductive capping layer 40 may comprise another metal-containing layer, such as titanium nitride (TiN). In one embodiment, the conductive capping layer 40 is applied over the unreacted portion of the metal-containing layer 34, and over the metal-dielectric alloy 38 if the metal-containing layer 34 is completely converted into the metal-dielectric alloy 38. In an alternative embodiment, the metal-dielectric alloy formation may occur after applying the conductive capping layer 40 over the metal-containing layer 34 rather than during or after deposition of the metal-containing layer 34, such as by thermally annealing the pattern mask workpiece 10 using thermal process 36 or by using a thermal deposition process for the conductive capping layer 40 at a temperature sufficient to activate a reaction between the metal of the metal-containing layer 34 and silicon (not shown).

Figure 1E:
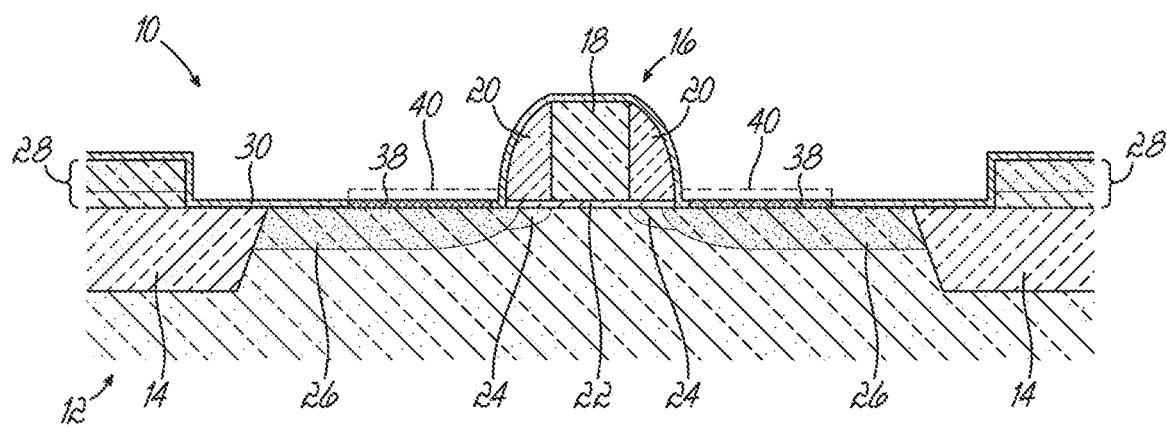

As shown in FIG. 1E, the un-reacted portion of the metal-containing layer 34 may be removed from the pattern mask workpiece 10. Optionally, the conductive capping layer 40 may be removed as well, particularly in instances where there is no remaining un-reacted metal-containing layer 34 over the metal-dielectric alloy 38 or, in stances where there is remaining un-reacted metal-containing layer 34 over the metal-dielectric alloy 38, no further reaction is desired that would utilize the remaining un-reacted metal-containing layer 34. The un-reacted portion of the metal-containing layer 34, the patterned mask 32, and the conductive capping layer 40 may be removed from the pattern mask workpiece 10 using a cleaning or etching process, such as a dry etching/cleaning process. Additionally, following this removal, the pattern mask workpiece 10 may be subjected to another thermal process, such as a thermal anneal process.

Figure 1F:
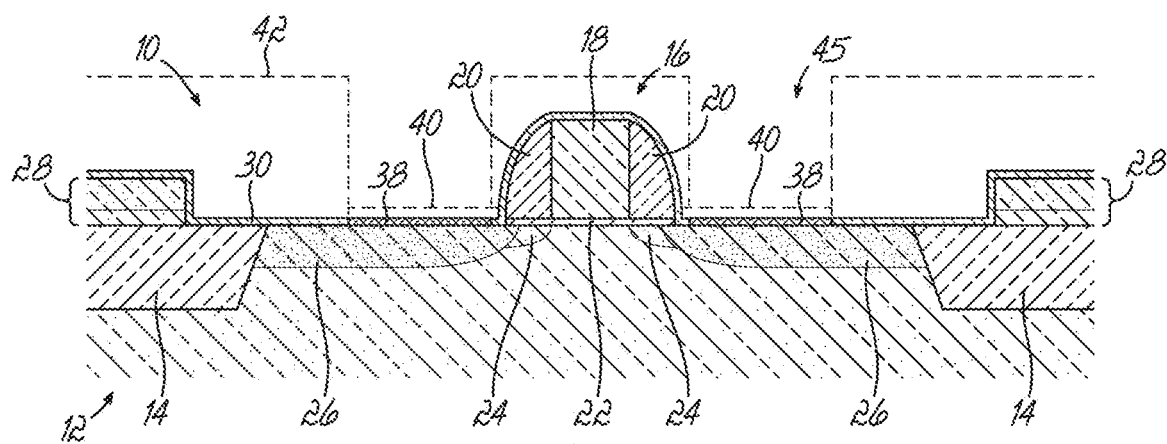

Thereafter, as shown in FIG. 1F, a dielectric layer 42 is deposited on the pattern mask workpiece 10 to serve as inter-layer insulation between the gate structure 16 and subsequent metal-interconnection layers (not shown) formed on the workpiece 10. The dielectric layer 42 may be deposited using a vapor deposition process, such as a physical vapor deposition (PVD) process or variations thereof, a chemical vapor deposition (CVD) or variations thereof, or an atomic layer deposition (ALD) process or variations thereof. One or more via(s) 45 are prepared to expose metal-dielectric alloy 38 and, if optionally present, the conductive capping layer 40. The one or more via(s) 45 may be formed using a via etch process, such as a dry etching process.

In an embodiment of the invention, the integrated sequence of processing steps further comprises a treatment of the workpiece before depositing the metal-containing layer. The treatment is performed to alter the semiconductor contact surface. The treatment may clean a surface, de-oxidize a surface, oxidize a surface, form a barrier layer on a surface, or alter a surface termination on a surface, or any combination thereof, and may include a single treatment step or multiple treatment steps. The common manufacturing platform may include one or more treatment modules for performing the treatment(s) in the controlled environment. The treatment module(s) may be a film-forming module, an etching module, an annealing module or other gas or plasma treatment module. In one example, a treatment module is included in the common manufacturing platform for depositing or forming a barrier or blocking layer to inhibit deposition of material on a non-target surface and to provide increased selectivity toward target surface relative to the non-target surface. For example, the treatment may increase the selectivity to a value of at least 100:1, or at least 1000:1. In an embodiment, the workpiece is treated to add surface termination groups. The non-target surface may be treated to add termination groups that are less reactive with the material to thereby inhibit deposition thereon, or the target surface may be treated to add termination groups that are more reactive with the material to thereby promote deposition thereon. For example, hydrophobic termination groups may be added to a non-target oxide surface to inhibit deposition of metal on the oxide. In another example, a target metal surface is de-oxidized to promote deposition of metal on the oxide-free metal surface.

In an embodiment of the invention, the integrated sequence of processing steps comprises a treatment of the workpiece to form a self-assembled monolayer (SAM) on the non-target surface. The SAM may be formed by exposing the workpiece to a reactant gas that contains a molecule that is capable of forming a SAM on the surface. The SAM is a molecular assembly that is formed spontaneously on substrate surfaces by adsorption and organized into more or less large ordered domains. The SAM can include a molecule that possesses a head group, a tail group, and a functional end group, and the SAM is created by the chemisorption of head groups onto the surface from the vapor phase at room temperature or above room temperature, followed by a slow organization of the tail groups. Initially, at small molecular density on the surface, adsorbate molecules form either a disordered mass of molecules or form an ordered two-dimensional "lying down phase," and at higher molecular coverage, over a period of minutes to hours, begin to form three-dimensional crystalline or semicrystalline structures on the surface. The head groups assemble together on the surface, while the tail groups assemble far from the surface.

According to one embodiment, the head group of the molecule forming the SAM can include a thiol, a silane, or a phosphonate. Examples of silanes include molecules that include C, H, Cl, F, and Si atoms, or C, H, Cl, and Si atoms. Non-limiting examples of the molecule include perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), and tertbutyl(chloro)dimethylsilane (($CH_3)_3CSi(CH_3)_2Cl$)).

The presence of the SAM on the non-target surface may be used to enable subsequent selective deposition on the target surface (e.g., a dielectric layer) relative to the non-target surface (e.g., a metal layer). This selective deposition behavior is unexpected and provides a new method for selectively depositing a film on the target surface while preventing or reducing deposition on the non-target surface. It is speculated that the SAM density is greater on the non-target surface relative to on the target surface possibly due to higher initial ordering of the molecules on the non-target surface relative to on the target surface.

According to a further embodiment, where a treatment step is performed on the non-target surface, the etching step may remove the treatment layer in addition to any material that deposits on the non-target surface, in one or more etching steps. Also, where the deposition and etching steps are repeated to build up the material on the target surface layer-by-layer, the treatment may likewise be repeated before each deposition step, or less frequently as desired or needed, such as every 5th or 10th repetition, or it may not need to be repeated, for example, repeating de-oxidation may not be needed if the workpiece is maintained in the controlled environment and not exposed to an oxidizing environment. Removal and subsequent repeated deposition of the SAM may be desired if the SAM becomes damaged during deposition of the material and/or during the etching process and therefore negatively affects deposition selectivity.

FIGS. 2A-2F schematically depict an embodiment of an area selective deposition (ASD) method in which a gate contact is formed for a workpiece. FIG. 3 is a flow chart of a process flow 300 applicable to the method of FIGS. 2A-2F. FIG. 5B illustrates an embodiment of a common manufacturing platform of the invention that may be used for performing process flow 300. The process flow 300 of FIG. 3 and the common manufacturing platform 500b of FIG. 5B will be referenced throughout the following sequential discussion of FIGS. 2A-2F in which an ASD workpiece 11 is described as it proceeds through an integrated sequence of processing steps.

Figure 2A:
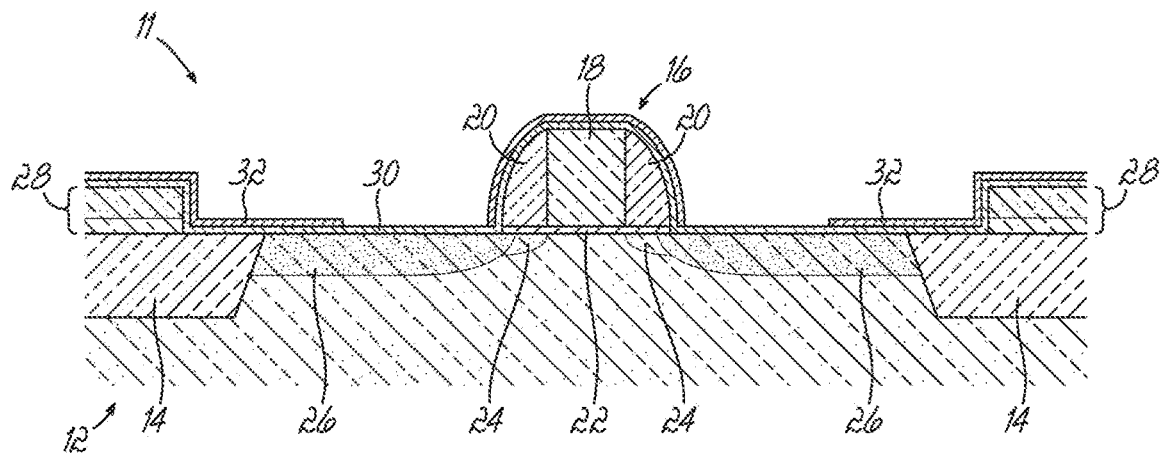
FIGS. 2A-2F are schematic cross-sectional diagrams illustrating one embodiment of a gate contact formation method.
Figure 3:
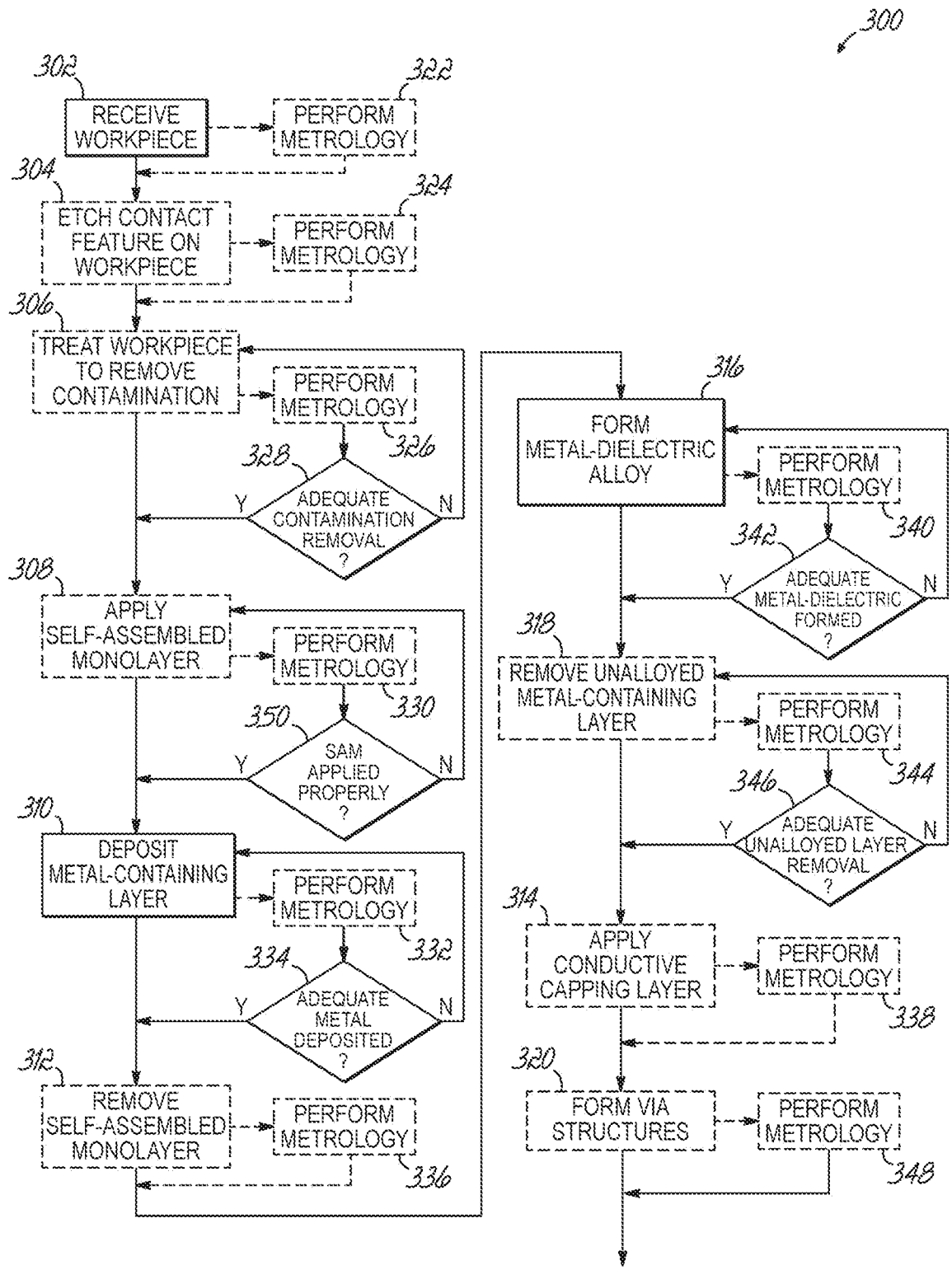
FIG. 3 is a flow chart diagram illustrating one embodiment of an integrated process flow for gate contact formation.

In operation 302 of process flow 300 and as shown in FIG. 2A, ASD workpiece 11 is provided into the common manufacturing platform 500b. The ASD workpiece 11 may include any number of material layers formed on a substrate 12, but at a minimum, the ASD workpiece 11 includes a contact dielectric film 30. As shown in FIG. 2A, the ASD workpiece 11 includes an additional material layer, namely patterned mask 32. The patterned mask 32 exposes a portion of the contact dielectric film 30, wherein the exposed portion of the contact dielectric film 30 is removed by operation 304 to create a semiconductor contact surface 33 on the ASD workpiece 11.

As shown in FIG. 5B, a transfer module 410a may be used to bring the ASD workpiece 11 into the controlled environment of the common manufacturing platform 500b, which controlled environment is maintained throughout the process flow 300. The controlled environment may include a vacuum environment, where each operation in the process flow 300 is conducted without breaking vacuum, or an inert gas atmosphere, or a combination thereof. A single transfer module may be coupled between each processing module or tool, or separate transfer modules 410 may be used for each tool transfer, as depicted in FIG. 5B. Transfer modules 410a-f may be collectively referred to herein as transfer modules 410 where appropriate. Where different processing modules on the common manufacturing platform 500b require different controlled environments, such as different vacuum pressures or vacuum in one module followed by a module with inert gas atmosphere, multiple transfer modules 410 may be used where the transfer modules 410 assist in implementing the transitions between the different controlled environments. While a single transfer module may be useful in a cluster-type tool where same-type processing modules are positioned in a circle around the transfer module, multiple transfer modules 410 may be more appropriate in an end-to-end platform configuration with different processing module types such as that depicted in FIG. 5B. However, the embodiments herein do not preclude an end-to-end platform configuration that utilizes a single transfer module that is coupled to each of the processing modules, or some configuration in between, for example, a common transfer module for adjacent same-type processing modules that are used in sequence.

As is well known in high volume manufacturing, a front-end module 402a may be used to load a cassette of workpieces (not shown), sequentially line up the workpieces and insert them into a load lock, then into a transfer module 410a in a controlled environment, and the transfer module 410a sequentially loads the workpieces into a processing module. In the common manufacturing platform 500b of an embodiment of the invention, in operation 302, the ASD workpiece 11, which has been received into the controlled environment, is loaded by the transfer module 410a into a first etching module 420 hosted on the common manufacturing platform 500b.

Figure 2B:
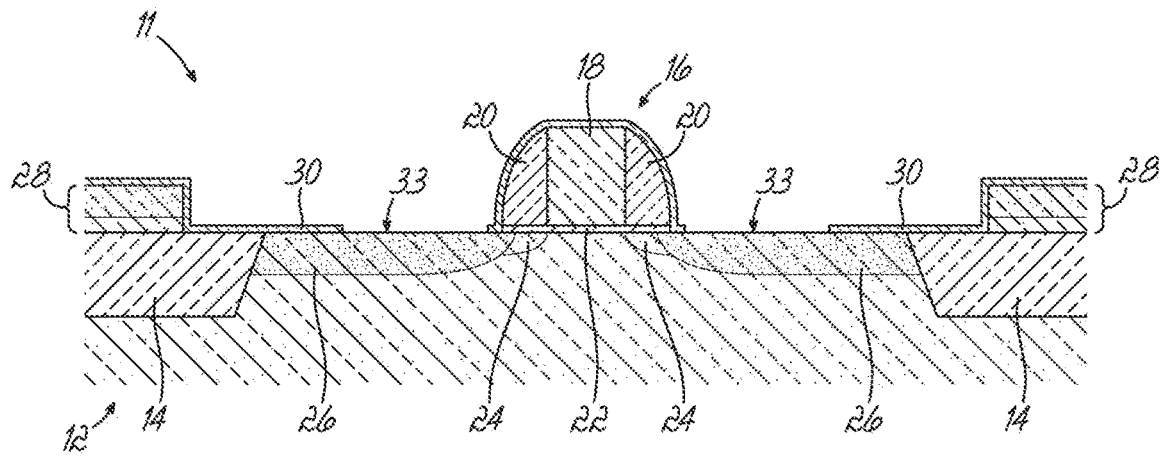

Referring to FIGS. 2B, 3, and 5B, in optional operation 304, in the first etching module 420, an etching process is performed to create a contact feature on ASD workpiece 11. For example, a dry etch process may be used to remove the portion of the contact dielectric film 30 that is exposed by the pattern mask 32, resulting in the exposure of the semiconductor contact surface 33. In other embodiments, ASD workpiece 11 may be received with the semiconductor contact surface 33 already exposed, thereby forgoing the need for optional operation 304.

Referring to FIGS. 3 and 5B, and further in operation 306, without leaving the controlled environment, e.g., without breaking vacuum, transfer modules 410a and 410b are used to transfer the ASD workpiece 11 to a second etching module 420. In the second etching module 420, or in the transfer modules 410a-410b, ASD workpiece 11 is assessed for contamination such as oxide deposits or other contamination, and an etching process may be used to remove the contamination. In one embodiment, the etching process may be a non-plasma chemical etch to remove contamination or prepare the semiconductor contact surface 33 for subsequent processing. Optionally, and as represented by FIGS. 2A-2F, if ASD workpiece 11 included a patterned mask 32, the second etching module 420, or another plasma-based etching module, may also use another etching process to remove the patterned mask 32 to expose the underlying contact dielectric film 30.

Figure 2C:
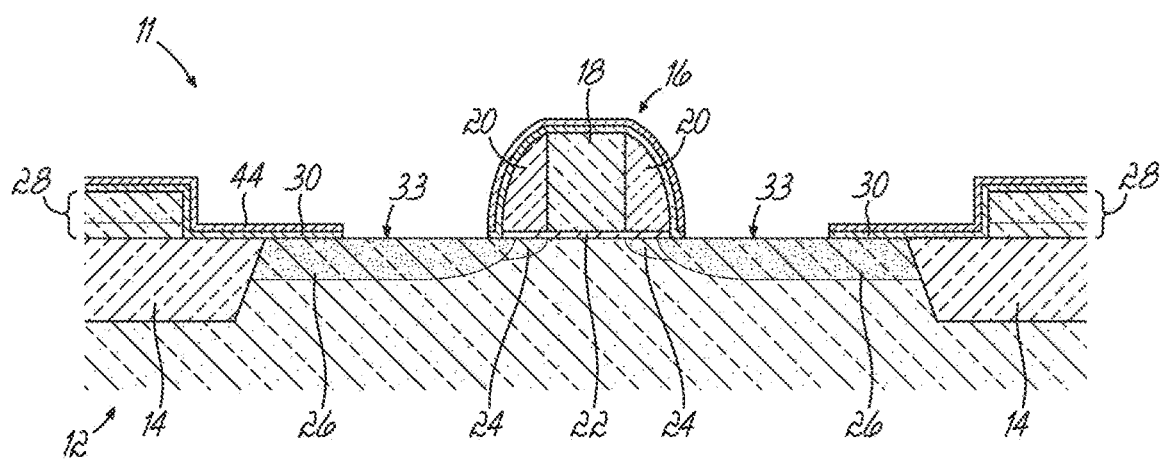

Then, without leaving the controlled environment, e.g., without breaking vacuum, transfer modules 410b and 410c are used to transfer the ASD workpiece 11 to a film-forming module 430. Referring to FIGS. 2C, 3, and 5B, in optional operation 308 a self-assembled monolayer (SAM) 44 is applied to ASD workpiece 11. Specifically, as shown in FIG. 2C, the SAM 44, a barrier layer, is applied to the contact dielectric film 30 so that the contact dielectric film 30 is rendered less attractive or reactive to the material to be deposited on the semiconductor contact surface 33 in operation 310. In other words, the SAM 44 may be applied to any exposed layer on the ASD workpiece 11 that is not the semiconductor contact surface 33, or the SAM 44 is deposited at faster rate on the contact dielectric surface 30 than on the semiconductor contact surface 33 at the ratios described above. While the SAM 44 is the exemplified barrier layer, it may be appreciated that the invention is not limited solely to a SAM as a barrier layer. The SAM 44 may be replaced with another barrier layer that has the effect of inhibiting deposition of material on a surface treated with the barrier layer. As shown, the common manufacturing platform 500b may include identical film-forming modules 430 on opposing sides of the transfer module 410c. By mirroring the two sides of the platform 500b, end-to-end processing can be achieved for two workpieces concurrently, and if one film-forming module 430 goes out of service temporarily, the platform 500b can continue to operate, at least at 50% capacity.

Figure 2D:
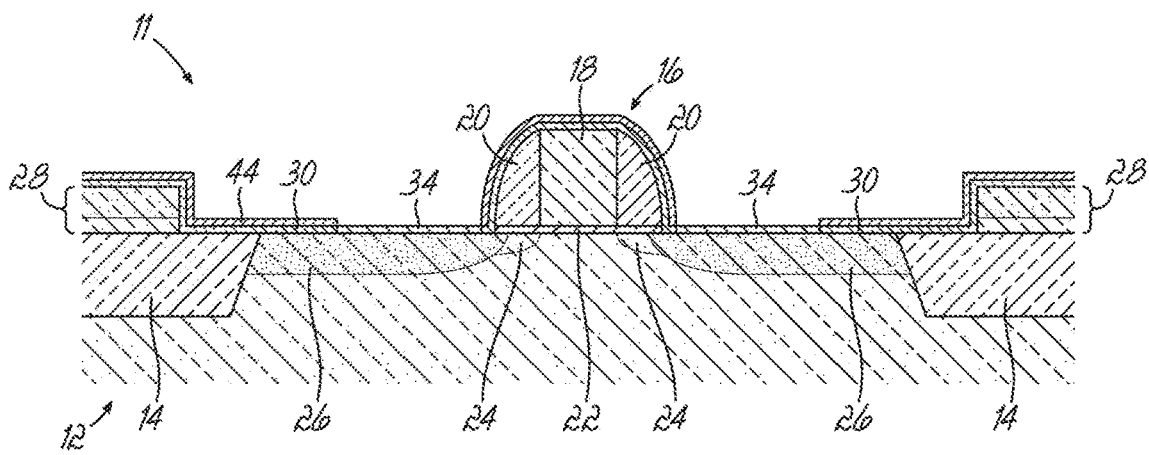

Subsequently, without leaving the controlled environment, e.g., without breaking vacuum, transfer modules 410c and 410d are used to transfer the ASD workpiece 11 to a film-forming module 430. Referring to FIGS. 2D and 3, in operation 310, in the film-forming module 430, a metal-containing layer 34 is selectively deposited on the semiconductor contact surface 33. Due to the selectivity toward the semiconductor contact surface 33 relative to the SAM 44, the metal-containing layer 34 forms on the semiconductor contact surface 33 at a higher deposition rate than on any other portion, such as the contact dielectric film 30, of ASD workpiece 11. In one example, the metal-containing layer 34 may include a metal film that contains Ti, Co, Ni, or Ru. The metal-containing layer 34 may, for example, be deposited by CVD, plasma-enhanced CVD (PECLD), ALD, plasma-enhanced ALD (PEALD), or physical vapor deposition (PVD). In some examples, the metal-containing layer 250 may be deposited by ALD using alternating exposures of a metal-containing precursor. Again, the common manufacturing platform 500b may include two identical film-forming modules 430 on opposing sides of the transfer module 410d.

The exposure to deposition gases in film-forming module 430 may, in addition to depositing the metal-containing layer 34 on the semiconductor contact surface 33, deposit film nuclei on the SAM 44 as a result of a loss of selectivity or insufficient selectivity. Loss of deposition selectivity can occur, for example, if the deposition process is carried out for too long. Insufficient or poor deposition selectivity can occur, for example, if surface coverage of the SAM 44 is incomplete and contains voids on the contact dielectric film 30. In this instance, remedial actions may be taken to improve SAM 44 surface coverage, as discussed in greater detail below.

Figure 2E:
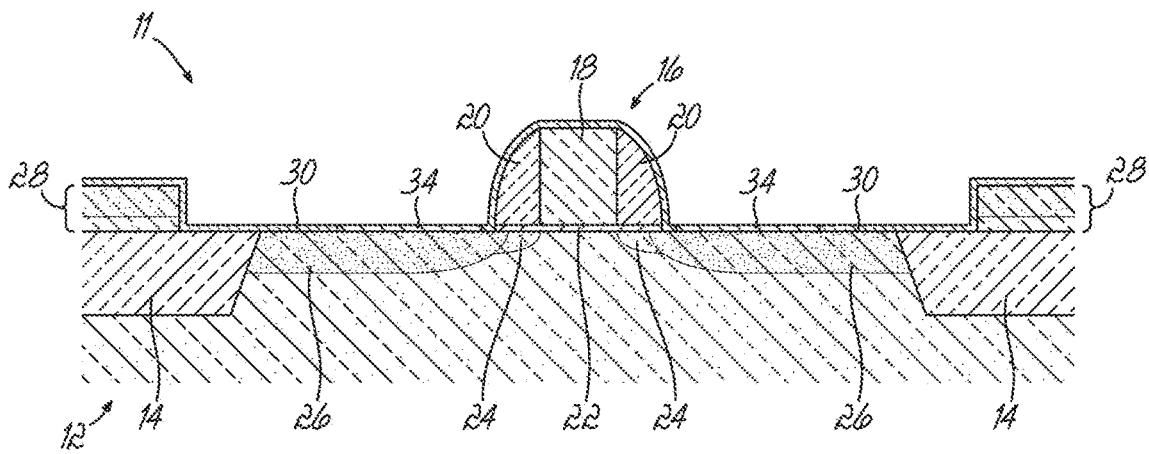

Referring to FIGS. 2E and 3, in operation 312, and without leaving the controlled environment, e.g., without breaking vacuum, the ASD workpiece 11 is transferred to one or more etching modules to perform one or more etching steps to expose the contact dielectric film 30 and thereby achieve the ASD on the semiconductor contact surface 33. In this example, and as shown in FIG. 5B, an etching step is performed to remove the SAM 44. Transfer modules 410d and 410e are used to transfer the ASD workpiece 11 to a third etching module 420 hosted on the common manufacturing platform 500b, e.g., transfer module 410d removes the ASD workpiece 11 from film-forming module 430 and transfers it to transfer module 410e, which then delivers the ASD workpiece 11 into the third etching module 420. Adjustments to the controlled environment may be made in transfer modules 410d and 410e if the third etching module 420 operates with different parameters than the film-forming module 430, such as different vacuum pressures. The etching process can include a dry etching process, a wet etching process, or a combination thereof. Again, the common manufacturing platform 500b may include identical third etching modules 420 on opposing sides of the transfer module 410e. Alternatively, the SAM 44 may be removed by a different method, such as by heat treatment, in a designated treatment module or in one of the processing modules used in another step of the integrated sequence of processing steps.

Figure 2F:
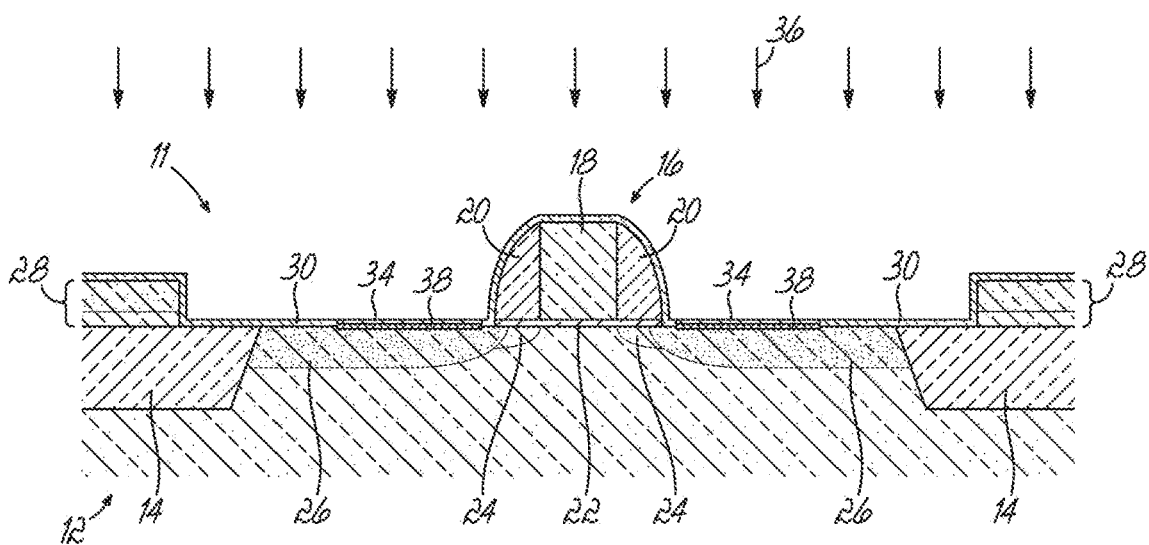

Then, without leaving the controlled environment, e.g., without breaking vacuum, transfer modules 410e and 410f are used to transfer the ASD workpiece 11 to a film-forming module 430. Referring to FIGS. 2F, 3, and 5B, in operation 316 a thermal process 36 is applied on ASD workpiece 11 to form a metal-dielectric alloy 38. The thermal process 36 may be realized using a heat treatment, using an anneal chamber 440, such that the metal-containing layer 34 and a portion of the source/drain region 26 combine into an alloy, wherein the resistance of the alloy is lower than the source/drain region 26 and higher than the metal-containing layer 34. In alternative embodiments, the film-forming module 430 may perform additional operations, such as optional operation 314 to apply a conductive capping layer.

Upon completion of process flow 300, the ASD workpiece 11 exits the common manufacturing platform 500b via another front-end module 402b, which may be identical to front-end module 402a, although located at the back end of the end-to-end arrangement of modules on common manufacturing platform 500b. In the generally reverse process of front-end module 402a, the ASD workpieces 11 are sequentially transferred by transfer module 410f to a load lock where the controlled environment is removed and then into a cassette (not shown) on the front-end module 402b. The common manufacturing platform 500b arranged in a substantially mirrored fashion has the advantage of providing redundancy in the event a module has to go out of service, where the common manufacturing platform 500b could still operate at a reduced capacity.

In one embodiment, and as will be discussed in more detail below, the common manufacturing platform 500b advantageously includes, and is controlled by, an "active interdiction control system." The active interdiction control system includes a workpiece measurement region within a transfer module 410 hosted on the common manufacturing platform 500b or an integrated metrology module (not shown) hosted on the common manufacturing platform 500b. The workpiece measurement region may be located in a dedicated area of the transfer module 410, as described in more detail below. The workpiece measurement region or metrology module may include an inspection system for gathering measurement data. As described in more detail below, the inspection system may include at least one optical source for directing an optical beam incident on a measurement surface of the workpiece and at least one detector arranged to receive an optical signal scattered from the measurement surface of the workpiece. The active interdiction control system may further include an intelligence system hosted on the common manufacturing platform 500*b* that is configured to gather data from the workpiece measurement region or metrology module and control the integrated sequence of processing steps executed on the common manufacturing platform 500*b*, such as process flow 300.

For active interdiction in accordance with embodiments of the invention, the workpiece measurement region or metrology module collects real time data "on the fly" pertaining to attributes of features or layers on the semiconductor workpiece (e.g., film or feature thickness, feature depth, surface roughness, pattern shift, voids or other defects, loss of selectivity, lateral overgrowth, uniformity, etc.) and uses such real time data to concurrently control integration operating variables in the integrated processing modules hosted on the common manufacturing platform 500*b*. The data can be used in a feed-back and/or feed-forward manner to control operations performed on the workpiece in subsequent modules and/or to control operations performed in prior modules on a subsequent workpiece, for example as will be explained below with reference to operations 322-348 of FIG. 3. In an embodiment, the common manufacturing platform 500*b* includes a correction module, which may be a film-forming module 430, an etching module 420, or other type of treatment module as appropriate for applying corrective action or remedial treatment to the ASD workpiece 11.

Unlike traditional metrology or process control, the workpiece does not leave the controlled environment to enter a stand-alone metrology tool thereby minimizing oxidation and defect generation, the measurements are non-destructive such that no workpiece is sacrificed to obtain data thereby maximizing production output, and the data can be collected in real time as part of the process flow to avoid negatively impacting production time and to enable in-process adjustments to the workpiece or to subsequent workpieces being sequentially processed on the common manufacturing platform 500*b*. Additionally, the measurements are not performed in the film-forming or etching modules, thereby avoiding issues when measurement devices are exposed to process fluids. For example, by incorporating workpiece measurement regions into the transfer module, the data can be obtained as the workpiece is traveling between processing tools with little to no delay in the process flow, without exposure to process fluids, and without leaving the controlled environment, e.g., without breaking vacuum. While the "on the fly" data may not be as accurate as the data obtained from traditional destructive methods performed in stand-alone metrology tools, the nearly instantaneous feedback on the process flow and ability to make real-time adjustment without interrupting the process flow or sacrificing yield is highly beneficial for high-volume manufacturing.

With further reference to the process flow 300 of FIG. 3, the method may include inspecting the workpiece, such as performing metrology, i.e., obtaining measurement data, using the active interdiction control system at any of various times throughout the integrated method, without leaving the controlled environment, e.g., without breaking vacuum. Inspection of the workpiece may include characterizing one or more attributes of the workpiece and determining whether the attribute meets a target condition. For example, the inspection may include obtaining measurement data related to an attribute and determining whether a defectivity, thickness, uniformity, and/or selectivity condition meets a target for that condition. While the following discussion will focus on obtaining measurement data, it may be understood that other inspection techniques performed within the controlled environment of the common manufacturing platform are also within the scope of the invention.

The active interdiction control system may include a single metrology module or workpiece measurement region on the common manufacturing platform 500*b* or may include multiple metrology modules or workpiece measurement regions on the common manufacturing platform 500*b*, as will be discussed in more detail below. Each metrology operation is optional, as indicated by the phantom lines in FIG. 3, but may be advantageously performed at one or more points in the process flow to ensure the ASD workpiece 11 is within specification. In one embodiment, measurement data is obtained after each step of the integrated sequence of processing steps conducted on the common manufacturing platform. The measurement data may be used to repair the workpiece in a correction module prior to leaving the common manufacturing platform, and/or may be used to alter parameters of the integrated sequence of processing steps for subsequent steps and/or for subsequent workpieces.

In broad terms, within the controlled environment, measurement data may be obtained during the integrated sequence of processing steps related to the selective deposition of the additive material and, based on the measurement data, a determination may be made whether defectivity, thickness, uniformity, and/or selectivity of the layer of additive material meets a target condition. When the defectivity, thickness, uniformity, and/or selectivity is determined to not meet the target condition, or an attribute of the workpiece is otherwise determined to be non-conforming, the workpiece may be subjected to further processing. For example, the workpiece may be processed in a correction module on the common manufacturing platform to remove, minimize, or compensate for the non-conforming attribute prior to performing a next processing step in the integrated sequence of processing steps. The corrective action may include etching surface on the workpiece, depositing further material on the workpiece, repairing a barrier layer on the workpiece, thermally treating the workpiece, or plasma treating the workpiece.

In one example, the corrective action may include removing the SAM when the non-conformity is based, at least in part, on incomplete coverage by the SAM or when an amount of exposed area is greater than a predetermined exposed area threshold. In another example, the corrective action may include etching the workpiece when the non-conformity is based, at least in part, on an inadequate amount of contamination removed from the workpiece based on a predetermined threshold. In yet another example, the corrective action may include additional deposition of the metal-containing layer when the non-conformity is based, at least in part, on an inadequate thickness of the metal-containing layer based on a predetermined threshold. In a still further example, the corrective action may include providing additional thermal treatment when the non-conformity is based, at least in part, on an inadequate amount of metal-dielectric alloy formation based on a predetermined threshold. In another example, the corrective action may include etching the workpiece when the non-conformity is based, at least in part, on a remaining additive material on the non-target surface or a remaining self-assembled monolayer on the non-target surface being greater than a predetermined remaining thickness threshold. In yet another example, the corrective action may include removing the remainder of the metal-containing layer when the non-conformity is based, at least in part, on the metal-containing layer that did not react in the formation of the metal-dielectric alloy.

The correction modules may be different film-forming and etching modules that are designated as correction modules on the common manufacturing platform or another type of treatment module integrated on the common manufacturing platform, such as a thermal annealing module, or may be the same film-forming and etching modules used to selectively deposit the additive material and etch the film nuclei.

The process flow 300 of FIG. 3 will now be described in detail. Various optional operations are included in the description of the process flow 300. The optional inspection or metrology operations are used to characterize attributes of the workpiece to determine, for example, when a target thickness is reached and/or if a non-conformality is present. Optional operations such as the self-assembled monolayer application or removal are used to process a workpiece using the area selective deposition method instead of the patterned mask method. Further optional operations include etching a contact feature on a workpiece, removing contamination from a workpiece, applying a conductive capping layer, and forming via structures and are selected according to the type of workpiece processing desired with the common manufacturing platform.

Operation 302 includes receiving a workpiece having or not having a contact feature into a common manufacturing platform. If the workpiece lacks a contact feature, the workpiece may be received with an additional patterned mask layer. Similarly, a workpiece that is intended to be processed using the patterned mask method may be received with an additional patterned mask layer. Operation 322 includes optionally performing metrology to obtain measurement data related to attributes of the incoming workpiece, such as detecting the level of contamination within the contact feature or measuring the thickness of the surface at the bottom of the contact feature to determine the amount of oxide on the surface, which measurement data may be used to adjust and/or control process parameters of any one of operations 302-320.

Operation 304 includes optionally etching a contact feature on the workpiece, if the workpiece is received without a contact feature. Operation 324 includes optionally performing metrology to obtain measurement data related to attributes of the etched contact feature, such as thickness, width, and/or profile (e.g., top-to-bottom width differences). Thereafter, the measurement data may be used to adjust and/or control process parameters of any one of operations 304-320 to take corrective or remedial actions to address any non-conforming attributes.

Operation 306 includes optionally treating the workpiece to remove contamination. Operation 326 includes optionally performing metrology to obtain measurement data related to attributes of the workpiece following treatment, such as detecting the level of contamination within the contact feature or on the workpiece. For example, the contamination may be native oxide and/or etch residue, from the contact etching process, on the semiconductor contact surface 33. Methods such as high-resolution optical imaging and microscopy, hyperspectral (multi-spectral) imaging, interferometry, spectroscopy, Fourier transform Infrared spectroscopy (FTIR) reflectometry, scatterometry, spectroscopic ellipsometry, polarimetry, refractometers or non-optical imaging systems may be used to obtain measurement data, such as oxide thickness, sidewall feature profile, particles, and/or contamination on the bottom, sidewall, or top of the contact feature. Thereafter, the measurement data may be used to adjust and/or control process parameters of any one of operations 306-320, including the contamination removal determination 328. For example, when the measurement data indicates that there is not adequate contamination removal, such that the contamination removal determination 328 is No, the workpiece may be subjected to repeating operation 306. For example, the workpiece may be processed through an etching module to remove the remaining contamination and/or modify the contact feature thickness, width, and/or profile using the metrology data from operation 324. When the measurement data indicates that there is adequate contamination removal, such that the contamination removal determination 328 is Yes, the workpiece advances to the next operation (e.g., operation 308 or 310).

Operation 308 includes optionally depositing a self-assembled monolayer (SAM) on the workpiece, if the workpiece is being processed under the ASD method. Operation 330 includes optionally performing metrology to obtain measurement data related to attributes of the deposited SAM, such as thickness or density using methods such as high-resolution optical imaging and microscopy, hyperspectral (multi-spectral) imaging, interferometry, spectroscopy, Fourier transform Infrared spectroscopy (FTIR) reflectometry, scatterometry, spectroscopic ellipsometry, polarimetry, or refractometers. For example, the imaging techniques may be used to assess the SAM attributes based on historical data or models used by the active interdiction control system 622 to determine the thickness and density of the SAM. Thereafter, the measurement data may be used to adjust and/or control process parameters of any one of operations 308-320 or take corrective or remedial actions to insure proper sufficient selectivity between the SAM 44, contact dielectric film 33, and the semiconductor contact surface 30. In one embodiment, one or more of the aforementioned measurement techniques may be used to obtain the attributes of the SAM 44, such as the thickness and/or density of the SAM 44. The thickness measurement may provide an indication of the orientation and/or alignment of the SAM molecules to detect whether the SAM molecules are leaning over the contact feature causing a partial masking of the contact feature, such that the subsequent metal deposition at the bottom of the contact feature is non-uniform or doesn't cover the entirety of the exposed semiconductor contact surface 30. Another concern with the SAM 44 relates to density which provides an indication of whether enough SAM is deposited on the contact dielectric film 30 to sufficiently mask, or prevent metal from being deposited on, the contact dielectric film 30 during subsequent metal deposition processes. Operation 350 includes using the metrology data from Operation 308 to determine whether the SAM 44 adequately covers the contact dielectric film 30, while allowing the semiconductor contact surface 33 to be SAM free or remain relatively SAM free for the purposes of forming an electrically viable metal contact. For example, if the metrology measurement indicates a relatively lower density of SAM, based on a predetermined threshold or historical performance, of SAM is present on the workpiece, and may trigger a remedial or corrective action, within the controlled environment, to address the incomplete SAM coverage of the contact dielectric film 30 and/or the gate structure 16. In this instance, additional SAM material may be applied to the workpiece using film-forming module 430 or the low-density SAM may be removed by one of the etching modules 420 and another SAM is applied to replace the low-density SAM. Alternatively, a metrology measurement indicating a relatively higher density of SAM is on the workpiece, this may mean too much SAM was applied where it's not intended to cover (e.g., semiconductor contact surface 33) and triggers a remedial action. In one embodiment, the remedial action may be to remove the high-density SAM and apply another SAM to insure adequate selectivity between the SAM 44 and the dielectric contact film 30, such that the SAM layer prevents metal deposition on the dielectric contact film 30, and allows metal deposition on the semiconductor contact surface 33 during subsequent processing.

Operation 310 includes depositing a metal-containing layer on the workpiece. When following the pattern mask method, the metal containing layer is deposited on the entire workpiece. Alternatively, under the ASD method, the metal-containing layer is deposited primarily within the contact feature on the workpiece. Operation 332 includes optionally performing metrology to obtain measurement data related to attributes of the metal-containing layer following treatment, such as thickness, resistance, uniformity, or conformality. Thereafter, the measurement data may be used to adjust and/or control process parameters of any one of operations 310-320, including the adequate metal deposition determination 334. For example, when the measure data indicates that there is not adequate metal deposition, such that the metal deposition determination 334 is No, the workpiece may be subjected to repeating operation 310 or removing at least a portion of the metal deposition to achieve an adequate amount (e.g., thickness) of metal deposition. When the measurement data indicates that there is adequate metal deposition, such that the metal deposition determination 334 is Yes, the workpiece advances to operation 312.

Operation 312 includes optionally removing SAM from the workpiece, if the workpiece is being processed under the ASD method or the pattern mask 32 under the mask layer embodiment. Operation 336 includes optionally performing metrology to obtain measurement data related to attributes of the workpiece, such as thickness or thickness non-uniformity, to assess whether the SAM layer or the pattern mask layer has been sufficiently removed from the workpiece. Thereafter, the measurement data may be used to adjust and/or control process parameters of any one of operations 312-320. For example, operation 312 may be repeated until the workpiece is adequately cleared of the aforementioned layers.

Operation 316 includes reacting a portion the metal-containing layer with a portion of the contact feature to form a metal-dielectric alloy on the workpiece. The reaction may be achieved, for example, by employing a heat treatment through a thermal process. Operation 340 includes optionally performing metrology to obtain measurement data related to attributes of the metal-dielectric alloy following formation, such resistance, with methods such as a film resistivity metrology system. Thereafter, the measurement data may be used to adjust and/or control process parameters of any one of operations 316-320, including the adequate metal-dielectric alloy determination 342. For example, when the measure data indicates that there is not adequate metal-dielectric alloy formed, such that the metal-dielectric alloy determination 342 is No, the workpiece may be subjected to repeating operation 316. When the measurement data indicates that there is adequate metal-dielectric alloy formed either by measuring sheet or contact resistance, thickness of the remaining unalloyed metal and/or alloyed metal, surface roughness or reflectivity of the exposed unalloyed or alloyed metal surface, such that the metal-dielectric alloy determination 342 is Yes, the workpiece advances to operation 318. If the metal-dielectric alloy determination 342 is No, the workpiece may undergo corrective action by annealing the workpiece until measurement data indicates that there is adequate metal-dielectric alloy formed. The anneal time and temperature may be optimized to a different time or temperature than the original annealing conditions, if needed. The time and temperature optimization may be implemented using models based on historical data or simulation of contact resistance for the gate structure 16 stored in the active interdiction control system 622.

Operation 318 includes optionally removing any unalloyed metal-containing layer to expose the metal-dielectric alloy on the workpiece, if an unalloyed metal-containing layer is present. In addition, unalloyed metal-containing layer not adjacent to the metal-dielectric alloy may also be removed. Further, when following the pattern mask method, removal may also include removing the patterned mask. Operation 344 includes optionally performing metrology to obtain measurement data related to attributes of the unalloyed metal-containing layer, such as resistance, thickness, and/or surface reflectivity. Thereafter, the measurement data may be used to adjust and/or control process parameters of any one of operations 318, 320, including the adequate layer removal determination 346. For example, when the measure data indicates that there is not adequate metal-containing layer removal, such that the adequate layer removal determination 346 is No, the workpiece may be subjected to repeating operation 318. When the measurement data indicates that there is adequate metal-containing layer removal, such that the adequate layer removal determination 346 is Yes, the workpiece advances to operation 320.

Operation 314 includes optionally depositing a conductive capping layer on the workpiece. The conductive capping layer may be deposited across the entire workpiece or within or proximate to the contact feature, wherein the conductive capping layer (e.g., Ti, TiN) can be different from the metal layer (e.g., Co) applied in operation 310. Operation 338 includes optionally performing metrology to obtain measurement data related to attributes of the conductive capping layer, such as thickness. Thereafter, the measurement data may be used to adjust and/or control process parameters of any one of operations 314-320.

Operation 320 includes optionally adding via structures on the workpiece or removing the workpiece from the controlled environment to form the via structures using additional stand-alone equipment. Operation 348 includes optionally performing metrology to obtain measurement data related to attributes of the via structures, such as thickness, width, and profile of the via. Thereafter, the measurement data may be used to adjust and/or control process parameters of operation 320. Completion of operation 320 denotes that the workpiece may exit the common manufacturing platform.

Process parameters, as referred to above, may include any operating variable within a processing module, such as but not limited to: gas flow rates; compositions of etchants, deposition reactants, purge gases, etc.; chamber pressure; temperature; electrode spacing; power; etc. The intelligence system of the active interdiction control system is configured to gather measurement data from the inspection system and control the integrated sequence of processing steps executed on the common manufacturing platform, for example, by making in situ adjustments to processing parameters in subsequent processing modules for the workpiece in process, or by changing process parameters in one or more processing modules for subsequent workpieces. Thus, the obtained measurement data may be used to identify a needed repair to the workpiece during the integrated sequence of processing steps to avoid having to scrap the workpiece, and/or to adjust processing parameters for the integrated sequence of processing steps for steps performed on the same workpiece after the measurement data is obtained or for processing subsequent workpieces to reduce occurrences of the target conditions not being met for the subsequent workpieces.

FIGS. 4A, 4B, 5A, and 5B illustrate various embodiments of the invention through multiple configurations of a common manufacturing platform. Certain modules of the common manufacturing platform, such as the annealing module, are depicted in only one embodiment for clarity of explanation and not as a limitation of use of the module.

Figure 4A:
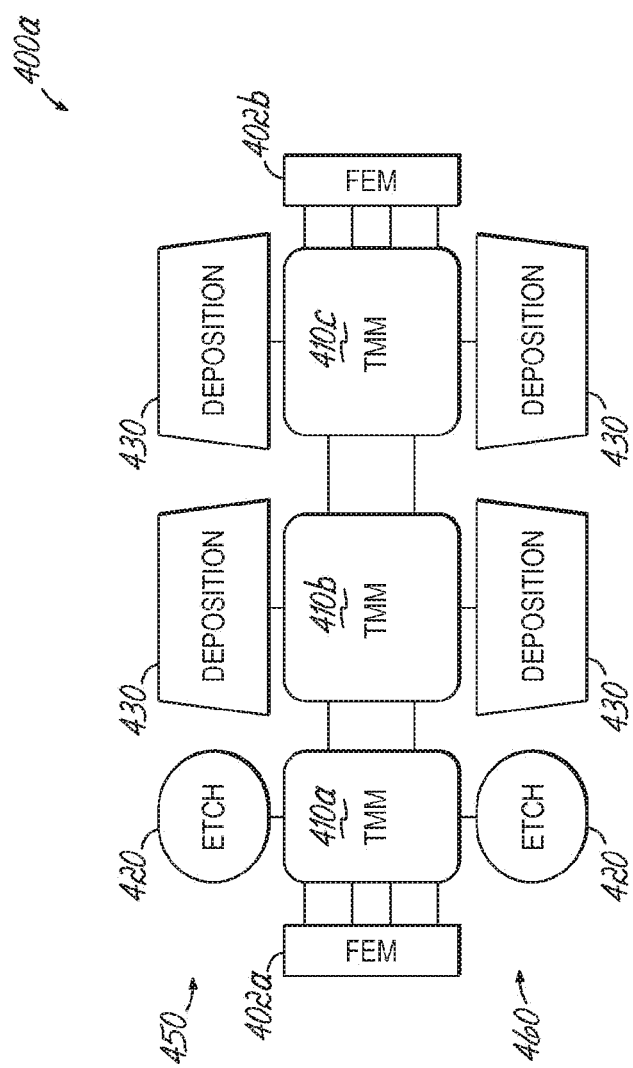
FIG. 4A is a schematic diagram illustrating one embodiment of a common manufacturing platform for performing gate contact formation using a patterned mask layer method.

With further reference to FIG. 4A, a common manufacturing platform for processing a pattern mask workpiece 10 is presented. The common manufacturing platform 400a generally includes at least one front-end module 402, for example one at each end of the common manufacturing platform 400a as shown for transferring pattern mask workpieces 10 into and out of the common manufacturing platform 400a. Common manufacturing platform 400a includes a plurality of transfer modules 410 for transferring workpieces into and out of a plurality of processing modules hosted on the common manufacturing platform 400a. The plurality of processing modules includes one or more dry etching modules 420, such as one or more dry etching chambers, wet etching chambers and/or Chemical Oxide Removal (COR) chambers (dry-chemical, non-plasma etch), and one or more film-forming modules 430, such as one or more deposition chambers to apply different films (e.g., dielectric, metal, SAM) on the workpiece. In the FIG. 4A embodiment, the dry etching modules 420 may be used to perform operation 306 in which the semiconductor contact surface 30 is treated to remove contamination using a non-plasma etching process, which relies on the reactivity of the process chemistry to isotopically (non-directional) etch the exposed semiconductor contact surface 30. In contrast, plasma-based etching relies on a combination of chemical reactivity and plasma to anistropically (directional) etch the workpiece, in which plasma is electrically-biased to direct charged particles (e.g., electrons) or molecules (e.g., ions) towards or away from the workpiece using a biased workpiece holder or electrode disposed within the vacuum environment. In most instances, the dry etching module 420 does include a grounded workpiece holder and does not include a biased workpiece holder or electrode within the vacuum environment. The film-forming modules 430 may be used to perform operations 310 or 314, in which a metal layer is deposited using known metal deposition techniques (e.g., CVD, PECVD, ALD, PEALD, or PVD). The film-forming modules 430 presented in FIGS. 4A-4B, 5A-5B are not required to be the same types of chambers and may vary depending on the operation intended to be performed within the framework of FIG. 3. For example, in the FIG. 4A embodiment, one of the film-forming modules 430 may deposit the metal contact layer (e.g., Co) and the second film-forming module 430 may apply the conductive capping layer (e.g., Ti), as described in operations 310 and 314, used to anneal metal contact layer (e.g., operation 316), or used to apply the SAM (e.g., operation 308). Any of the processing modules may serve as a correction module for repairing the workpiece, or additional processing modules may be added for performing remedial or corrective action.

In one example, a single pattern mask workpiece 10 is processed down line 450 from front end to back end or transferred between modules as needed based on module capability or availability. Thus, the contamination removal operation 306, metal-containing layer deposition operation 310, and conductive capping layer deposition operation 314 may be performed down line 450 to prepare a gate contact for the workpiece, then the contamination removal operation 306, metal-containing layer deposition operation 310, and conductive capping layer deposition operation 314 may be performed down line 460 as needed by a subsequent workpiece or to take corrective actions on workpiece 10, if needed, as noted in operations 328, 334, 342. Metal-dielectric alloy formation operation 316 may occur in one of film-forming modules 430. In another embodiment, another etching module 420 (e.g., plasma-based etching module) may be added to the common manufacturing platform to perform the contact etch operation 304.

In another example, the two lines 450, 460 operate independently to process two pattern mask workpieces 10 concurrently, either temporally in-phase or temporally offset, each progressing down one of the lines 450 or 460 from front end to back end, then transferred back to the front end and each processed again down the same line 450 or 460 for additional repetitions, if needed for corrective or remedial actions. Thus, the contamination removal operation 306, metal-containing layer deposition operation 310, and conductive capping layer deposition operation 314 are performed down each line 450 and 460 to prepare a gate contact for the workpiece. Metal-dielectric alloy formation operation 316 may occur in one of film-forming modules 430. This example has the advantage of providing redundancy in the event a module has to go out of service, where the common manufacturing platform 400a can still operate at 50% capacity.

A cleaning etch or repair process can be performed at the end of the first or a subsequent pass before transferring the pattern mask workpiece 10 back to the front end in order to clean or repair the workpiece before repeating the operations or before exiting the common manufacturing platform 400a. A correction module may be added in the lines 450, 460 for performing remedial or corrective actions (328, 334, 342).

Figure 4B:
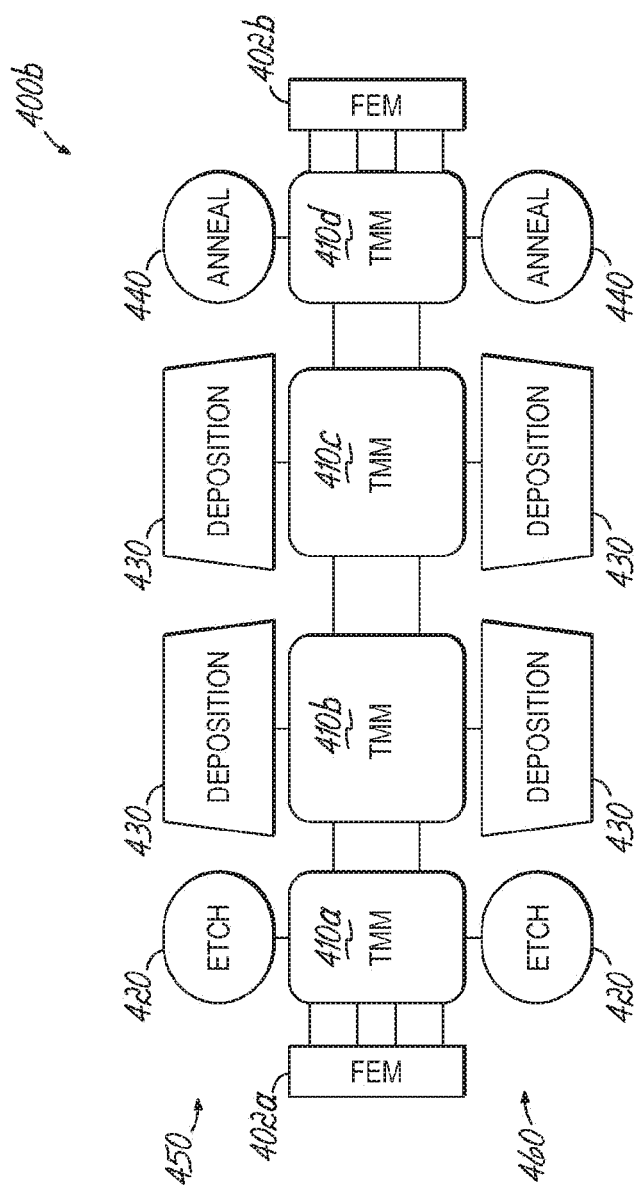
FIG. 4B is a schematic diagram illustrating another embodiment of a common manufacturing platform for performing gate contact formation using a patterned mask layer method.

FIG. 4B expands on the common manufacturing platform 400a as presented in FIG. 4A by the inclusion one or more annealing modules 440 and at least one additional transfer module 410 for transferring the pattern mask workpiece 10 between modules while maintaining a controlled environment throughout the integrated process flow, thereby depicting the common manufacturing platform 400b. The annealing module 440 carries out the metal-dielectric alloy formation operation 316 which may otherwise occur in one of film-forming modules 430 (e.g., dielectric or metal). For example, the annealing module 440 may include a heating element (e.g., resistive element or radiation source) and a temperature control system to control temperature across the workpiece. Additionally, placement of the annealing modules 440 is such that the contact feature formation operation 304, metal-dielectric alloy formation operation 316 is performed down each line 450 and 460, subsequent to contamination removal operation 306 and metal-containing layer deposition operation 310, and may proceed to the conductive capping layer deposition operation 314.

Figure 5A:
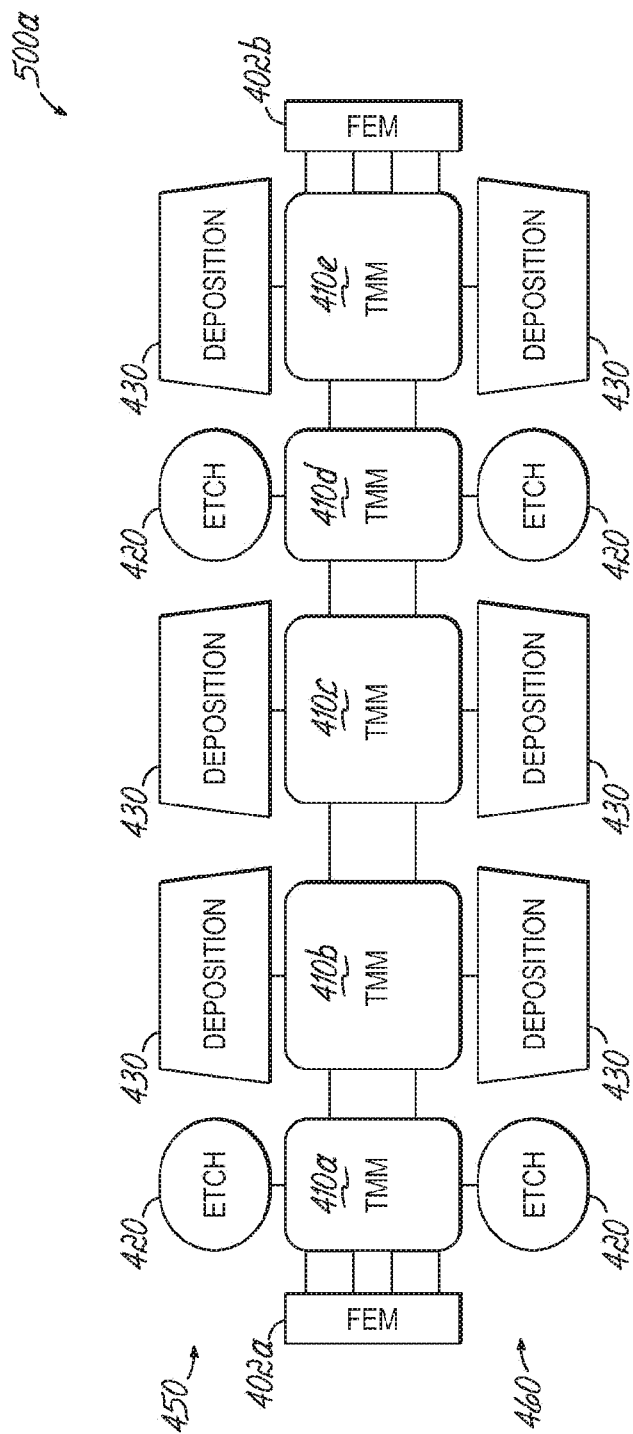
FIG. 5A is a schematic diagram illustrating one embodiment of a common manufacturing platform for performing gate contact formation using an area-selective deposition method.
Figure 5B:
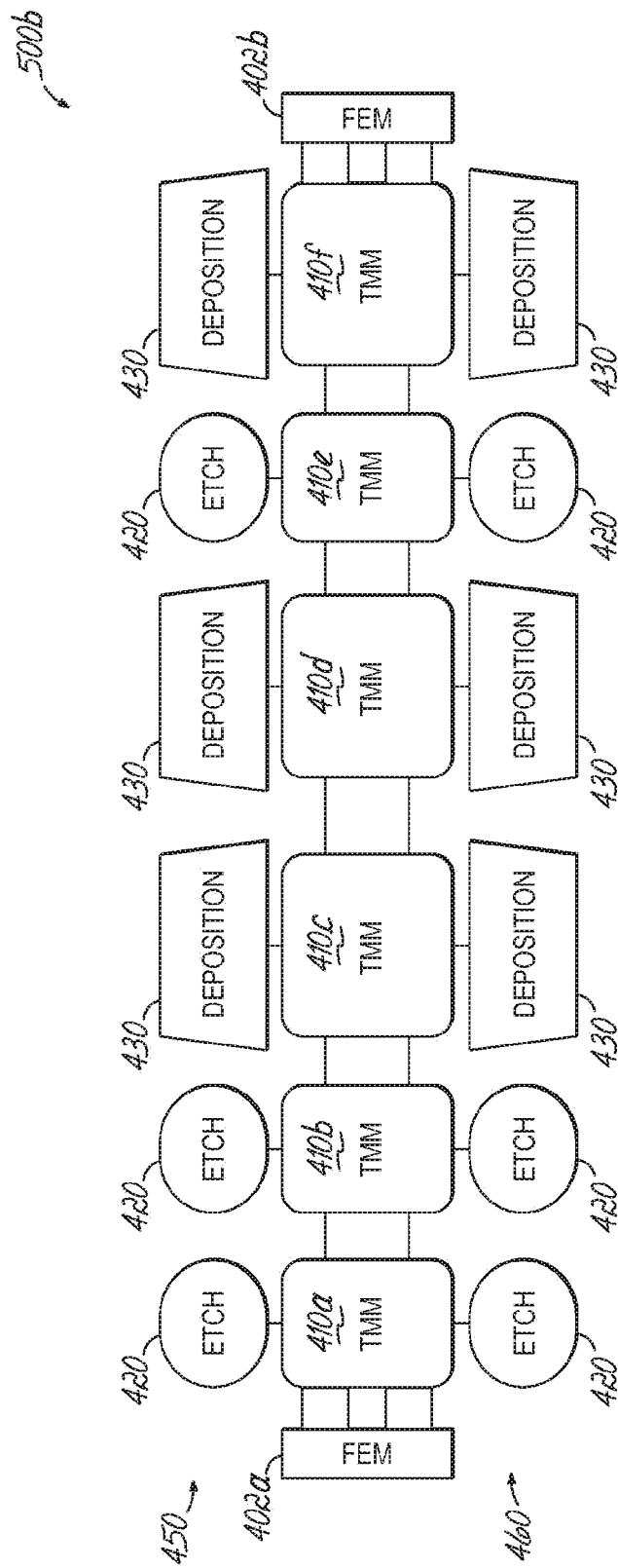
FIG. 5B is a schematic diagram illustrating another embodiment of a common manufacturing platform for performing gate contact formation using an area-selective deposition method.

In an additional embodiment as presented in FIG. 5A, common manufacturing platform 500a is configured to process area selective deposition workpiece (ASD) workpiece 11. The common manufacturing platform 500a generally includes at least one front-end module 402, for example one at each end of the common manufacturing platform 500a as shown for transferring ASD workpieces 11 into and out of the common manufacturing platform 500a. Common manufacturing platform 500a includes a plurality of transfer modules 410 for transferring workpieces into and out of a plurality of processing modules hosted on the common manufacturing platform 500a. The plurality of processing modules includes one or more etching modules 420, such as one or more dry etching chambers, wet etching chambers and/or COR chambers, and one or more film-forming modules 430, such as one or more deposition tools. The etching modules 420 may be used to perform operations 304, 306, 312, or 318. The film-forming modules 430 may be used to perform operations 308, 310, or 314. Any of the processing modules may serve as a correction module for repairing the workpiece, or additional processing modules may be added for performing corrective actions. As shown, the plurality of processing modules generally forms two lines 450, 460 from front end to back end, one line 450 down one side of a row of transfer modules 410 and the other line 460 down the other side of the row of transfer modules 410.

In one example, a single ASD workpiece 11 is processed down line 450 from front end to back end, then, if needed to complete gate contact formation transferred back to the front end and processed again down line 460. Thus, the contamination removal operation 306, self-assembled monolayer (SAM) application operation 308, metal-containing layer deposition operation 310, SAM removal operation 312, and conductive capping layer deposition operation 314 are performed on common manufacturing platform 500a. Metal-dielectric alloy formation operation 316 may occur in one of film-forming modules 430 and/or anneal module (not shown) incorporated into common manufacturing platform 500a.

FIG. 5B expands on the common manufacturing platform 500a as presented in FIG. 5A by the inclusion of additional etching modules 420 and at least one additional transfer module 410 for transferring the ASD workpiece 11 between modules while maintaining a controlled environment throughout the integrated process flow, thereby depicting the common manufacturing platform 500b. The additional etching module 420 carries out the contact feature formation operation 304 if ASD workpiece 11 is introduced into the common manufacturing platform 500b without a contact feature. Additionally, placement of the etching module 420 is such that the contact feature formation operation 304 is performed down each line 450 and 460, before any subsequent operation.

In a further embodiment, the common manufacturing platform includes at least one workpiece measurement region, which is located within a dedicated area of the at least one transfer module or within a metrology module hosted on the common manufacturing platform within the controlled environment, for obtaining measurement data related to one or more attributes of the workpiece. In one embodiment, the common manufacturing platform includes at least one correction module for performing a repair of the workpiece, such as repairing a SAM.

As may be appreciated by persons having ordinary skill in the art, the number and positioning of processing modules on the common manufacturing platform as well as metrology operations may be selected based on the processing time in the different modules needed to carry out the operations in the different modules to provide essentially continuous process flow through the common manufacturing platform and thus good throughput matching.

As disclosed herein the term "metrology module" or "measurement module" refers to a module/system/sensor/tool that can make measurements on a workpiece to detect or determine various non-conformities or variations on the workpiece, such as parametric variations, or to detect or determine defects on the workpiece, such as a contamination of some kind. As used herein, the term "inspection system" will generally refer to the tool or system of a measurement process or module that measures and collects data or signals associated with the measurement. The measurement modules will make measurements and provide data for use in the processing platform as disclosed further herein. The terms "metrology module" and "measurement module" will be used interchangeably herein, and generally refer to measurement or metrology or sensing tools used to detect and measure attributes of a workpiece that are indicative of the processing of the workpiece and the layers and devices being formed thereon.

To move workpieces between the various processing modules, the common manufacturing platform will generally incorporate one or more workpiece transfer modules that are hosted on the common manufacturing platform and are configured for the movement of the workpiece between the processing modules and the measurement module(s). A measurement module might be coupled with the workpiece transfer module similar to a processing module. In some embodiments of the invention, as disclosed herein, a measurement module or the inspection system associated therewith is incorporated with or inside a transfer module to provide for measurement or metrology as the workpiece is moved between processing modules. For example, a measurement module, or a portion thereof, might be positioned inside an internal space of the transfer module. Herein, the combination transfer and measurement apparatus will be referred to as a transfer measurement module ("TMM").

In one embodiment, the common manufacturing platform including both processing chambers and measurement modules is actively controlled by a system that processes the measured data associated with an attribute on the workpiece and uses the measured data for controlling movement and processing of the workpiece in a processing sequence. In accordance with embodiments of the invention, the control system uses measured data and other data to perform corrective processing based in part on the measured data to provide active interdiction of the processing sequence to correct non-conformities or defects. More specifically, an active interdiction control system is hosted on the common manufacturing platform and is configured to perform corrective processing based in part on the measured data, wherein the corrective processing of the workpiece might be performed in the processing modules of the platform that are upstream or downstream in the process sequence to address situations where non-conformities or defects are detected. In an embodiment of the invention, the workpiece is maintained in a controlled environment, such as under vacuum, for example. That is, on the common manufacturing platform, the processing modules and the measurement module operate in a controlled environment, and the workpiece transfer module transfers the workpiece between the plurality of processing modules in the processing sequence and one or more measurement modules without leaving the controlled environment.

As used herein, the term "active interdiction" refers generally to the control system as implemented for capturing measurement/metrology data in real time with respect to various fabrication processes to obtain data on workpiece attributes and thereby detect non-conformities or defects and the corrective aspects of the control to correct or ameliorate the non-conformities or defects. The active interdiction control system uses the data for correction and amelioration of various non-conformities in the semiconductor fabrication process by actively varying the processing sequence and/or the operation of modules that perform process steps. Thus, the active interdiction control system also interfaces with one or more transfer modules (e.g., 410) used to move workpieces through the process. The active interdiction control system (622 in FIGS. 6 and 722 in FIGS. 7A-7D, as further described below) coordinates the data collection and data analysis and detection of non-conformities with the fabrication process and further directs the actions of multiple processing modules so as to address the non-conformities or defects that are detected. The active interdiction control system is implemented generally by one or more computer or computing devices as described herein that operate a specially designed sets of programs such as deep learning programs or autonomous learning components referred to collectively herein as active interdiction components. As may be appreciated, the active interdiction control system may incorporate multiple programs/components to coordinate the data collection from various measurement modules and the subsequent analysis. The active interdiction control system interfaces with the multiple processing modules in the common manufacturing platform in order to address various measured non-conformities/defects to correct or ameliorate the non-conformities/defects. The active interdiction control system will thereby control one or more of the processing modules and the processing sequence to achieve the desired results of the invention, which may be referred to as the target conditions or predetermined thresholds.

The active interdiction control system also controls the transfer modules in order to move the workpieces to upstream and/or downstream processing modules when non-conformities/defects are detected. That is, depending upon what is detected, the system of the invention may move the workpiece further along in the processing sequence, or may direct the workpiece to a correction module or to an upstream processing module to correct or otherwise address a detected non-conformity or defect. As such, feedforward and feedback mechanisms are provided through the transfer modules to provide the active interdiction of the invention. Furthermore, the processing sequence might be affected upstream or downstream for future workpieces.

The active interdiction features of the invention improve performance, yield, throughput, and flexibility of the manufacturing process using run-to-run, wafer-to-wafer, within the wafer and real-time process control using collected measurement/metrology data. The measured data is collected, in real time during the processing, without removing the workpiece/substrate/wafer from the controlled processing environment. In accordance with one feature of the invention, in a common manufacturing platform, the measurement data may be captured while the substrate remains in a controlled environment, such as under vacuum, for example. That is, the workpiece transfer module(s) are configured for transferring the workpiece between the plurality of processing modules and the measurement modules without leaving the controlled environment. The active interdiction control can provide a multivariate, model-based system that is developed in conjunction with feed-forward and feedback mechanisms to automatically determine the optimal recipe for each workpiece based on both incoming workpieces and module or tool state properties. The active interdiction control system uses fabrication measurement data, process models and sophisticated control algorithms to provide dynamic fine-tuning of intermediate process targets that enhance final device targets. The interdiction system enables scalable control solutions across a single chamber, a process tool, multi-tools, a process module and multi-process modules on a common manufacturing platform using similar building blocks, concepts, and algorithms as described herein.

Figure 6:
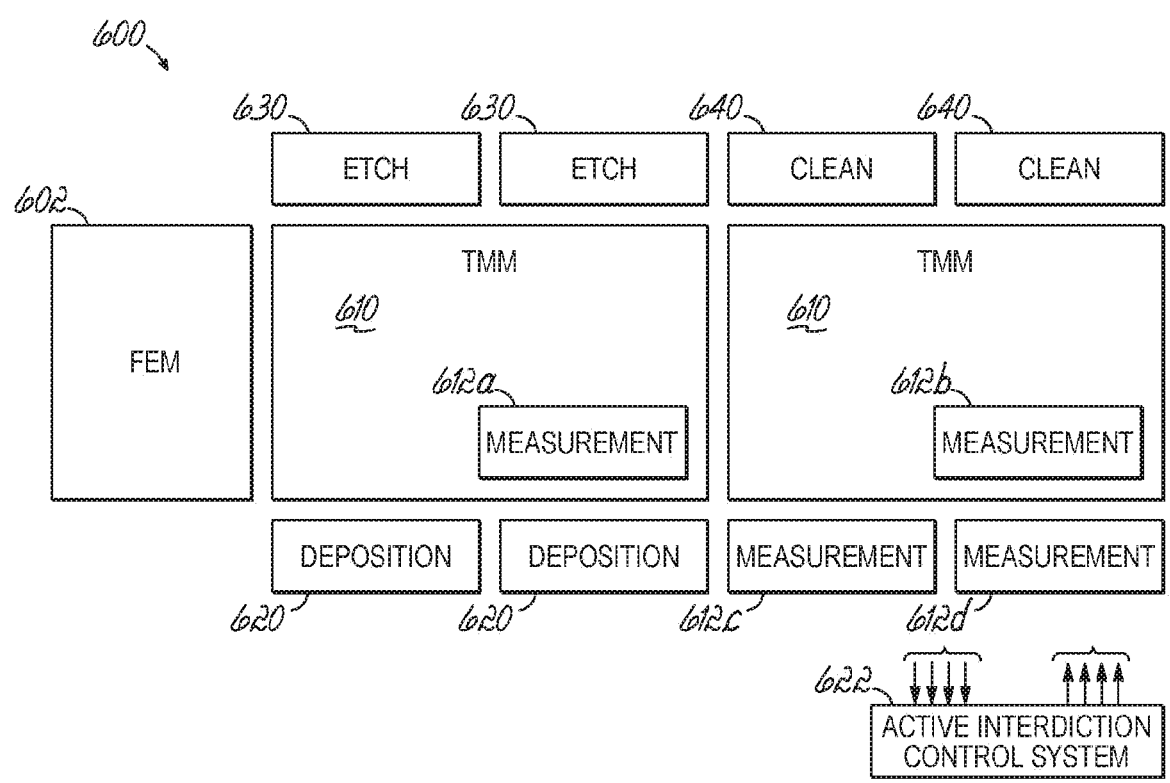
FIG. 6 is a schematic diagram illustrating one embodiment of a common manufacturing platform for performing an integrated sequence of processing steps.

FIG. 6 is a schematic diagram of another system for implementing an embodiment of the present invention on a common manufacturing platform 600. The platform 600 incorporates a plurality of processing modules/systems for performing integrated workpiece processing and workpiece measurement/metrology under the control of an active interdiction control system 622 according to embodiments of the invention. FIG. 6 illustrates an embodiment of the invention wherein one or more workpiece measurement modules are coupled together with one or more workpiece processing modules through one or more transfer modules. In that way, in accordance with features of the invention, an inspection of the workpiece may be made to provide the measurement data associated with an attribute of the workpiece, such as regarding material properties of the workpiece and the various thin films, layers and features that are formed on the workpiece while the workpiece remains within the common manufacturing platform. As discussed herein, measurements and analysis may be made immediately upon completion of processing steps, such as an etch or deposition step, and the measurement data gathered may be analyzed and then used within the common manufacturing platform to address any measurements or features that are out of specification or non-conformal or represent a defect with respect to the workpiece design parameters. The workpiece does not need to be removed from the common manufacturing platform to take corrective action, but rather, can remain under the controlled environment.

Referring to FIG. 6, common manufacturing platform 600 is diagrammatically illustrated. Platform 600 includes a front-end module 602 for introducing one or more workpieces into the manufacturing platform. As is known, the front-end module (FEM) may incorporate one or more cassettes holding the workpieces. The front-end module may be maintained at atmospheric pressure but purged with an inert gas to provide a clean environment. One or more workpieces may then be transferred into a transfer module 610, such as through one or more load-lock chambers (not shown) as discussed herein. The transfer modules of FIG. 6 are transfer measurement modules (TMM) that include measurement tools or inspection systems integrated therein for capturing data from a workpiece. Multiple TMM's 610 may be interfaced for providing movement of a workpiece through a desired sequence. The transfer measurement modules 610 are coupled with a plurality of processing modules. Such processing modules may provide various different processing steps or functions and may include one or more etch modules 630, one or more film-forming modules 620, one or more cleaning modules 640, and one or more measurement modules 612a, 612b, 612c, 612d. In accordance with embodiments of the invention as disclosed further herein, measurement modules may be accessed through the transfer modules 610 before or after each processing step. In one embodiment, the measurement modules, such as 612c, 612d, are located outside of the transfer modules 610 and are accessed to insert and receive workpieces similar to the various processing modules and may be referred to herein as metrology modules that reside within the controlled environment of the common manufacturing platform 600. Alternatively, measurement modules or at least a portion thereof, such as modules 612a, 612b, may be located in a respective transfer module. More specifically, all or a portion of a measurement module 612a, 612b is located in a transfer module 610 to define a measurement region therein where a workpiece might be positioned for measurement during a transfer process. The measurement region is located in a dedicated area of the transfer module 610 and is accessible by the transfer mechanism of the transfer module for positioning the workpiece. As noted, this makes the transfer module essentially a transfer measurement module (TMM) as discussed herein.

Generally, the transfer module defines a chamber therein that houses a transfer robot that is capable of moving workpieces, under vacuum, through various gate valves and access or transfer ports into various processing modules or measurement modules. By maintaining the measurement modules on the common manufacturing platform 600, they are readily accessed, such as between one or more of the processing steps to provide the necessary measured analytical data on-the-fly that will be used to address any workpiece out of specification or otherwise non-conformal with the workpiece design plans for a particular workpiece or to address detectable defects. In that way, real time data is provided to allow a fabricator to recognize problems early in the system so that remedial action may be taken in the current processing sequence, such as in a following processing step, in a previous processing step, and/or in a future processing step depending upon the captured data and the detected non-conformities or defects. In that way, productivity and efficiency may be increased, process monitoring overhead may be reduced, and wasted product, in the form of rejected or ejected workpieces may be reduced. This all provides a significant cost savings to a fabricator or device maker.

As noted, in one embodiment of the invention that incorporates the active interdiction control system 622, one or more measurement modules are hosted on a common manufacturing platform with processing modules for providing measured data regarding an attribute of the workpiece. The data is used by the active interdiction control system 622 for detecting non-conformities and for performing corrective processing of the workpiece when non-conformities are detected. The corrective processing is performed upstream and/or downstream in the process sequence when non-conformities are detected.

Figure 7A:
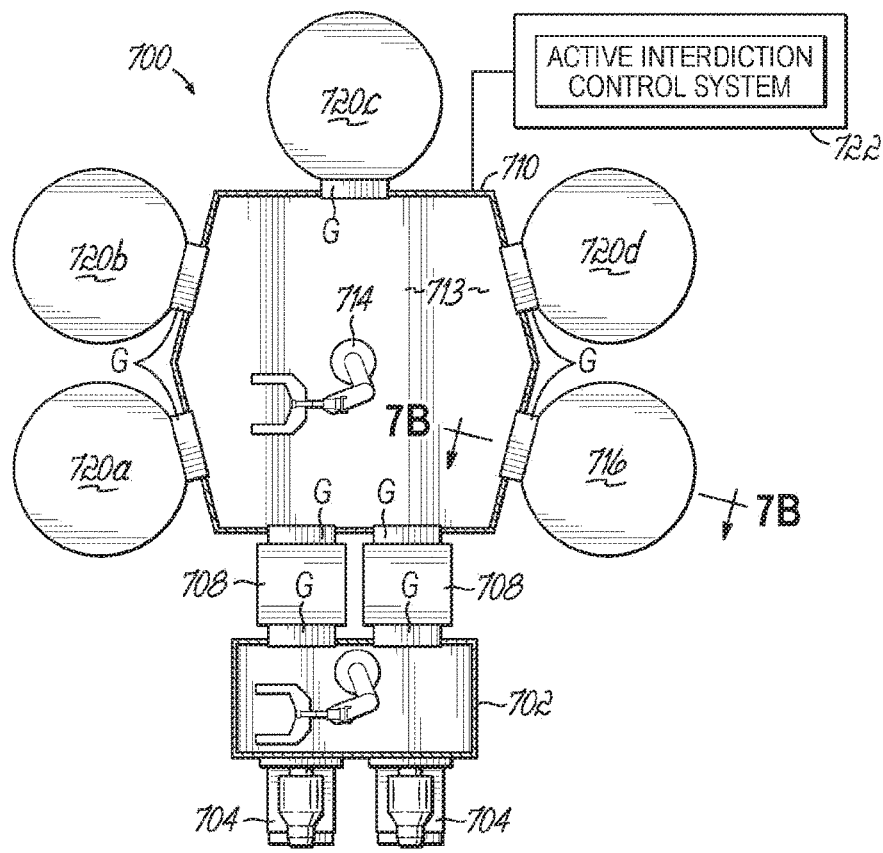
FIG. 7A is a schematic diagram illustrating in top view anther embodiment of a common manufacturing platform for performing an integrated sequence of processing steps.

Referring to FIG. 7A, an exemplary common manufacturing platform 700 suitable for practicing a method of ASD is illustrated. The common manufacturing platform 700 incorporates multiple modules and processing tools for the processing of semiconductor substrates for the fabrication of integrated circuits and other devices. The common manufacturing platform 700 incorporates one or more metrology/measurement modules that are incorporated within the common manufacturing platform 700 along with the processing modules. For example, the platform 700 may incorporate a plurality of processing modules that are coupled to a transfer module as shown. In some embodiments, a measurement module or tool is also positioned, at least partially, inside the transfer module. As such, a workpiece may be processed and then transferred immediately to a measurement module in order to collect various fabrication data associated with attributes of the workpiece that is further processed by the active interdiction control system. The active interdiction control system gathers data from the processing and measurement modules and controls a process sequence that is executed on the common manufacturing platform through the selective movement of the workpiece and control of one or more of the plurality of processing modules. Furthermore, the processing system of platform 700 may transfer a workpiece inside the chamber of the transfer module and between the various processing modules and the measurement/metrology modules without leaving the controlled environment of the common manufacturing platform 700. The active interdiction control system controls the sequential process flow through the various processing modules utilizing information that is derived from workpiece measurements obtained from the one or more measurement modules. Furthermore, the active interdiction control system incorporates processing modules in-situ measurements and data to control the sequential process flow through the platform 700. The on-substrate measurement data obtained in the controlled environment may be utilized alone or in combination with the in-situ processing module measurement data for process flow control and improvement of the process in accordance with the invention.

Turning again to FIG. 7A, common manufacturing platform 700 contains a front-end module 702 to introduce workpieces into the controlled environment. The exemplary platform 700 includes a plurality of processing modules 720a-720d and one or more measurement/metrology modules 716 organized around the periphery of a workpiece transfer module 710. Common manufacturing platform 700 includes cassette modules 704 and load-lock chambers 708 coupled to front-end module 702. The front-end module 702 is generally maintained at atmospheric pressure, but a clean environment may be provided by purging with an inert gas. Load-lock chambers 708 are coupled to the centralized workpiece transfer module 710 and may be used for transferring workpieces from the front-end module 702 to the workpiece transfer module 710 for processing in the controlled environment of the platform 700.

The workpiece transfer module 710 may be maintained at a very low base pressure (e.g., 5×10-8 Torr, or lower) or constantly purged with an inert gas. In accordance with the invention, a measurement/metrology module 716 may be operated under atmospheric pressure or operated under vacuum conditions. In accordance with one embodiment, the measurement module 716 is kept at vacuum conditions and the wafer is processed in platform 700 and measured without leaving vacuum. As disclosed further herein, the metrology module may include one or more inspection systems or analytical tools that are capable of measuring one or more material properties or attributes of a workpiece and/or of the thin films and layers deposited on the workpiece or the devices formed on the workpiece. As used herein, the term "attribute" is used to indicate a measurable feature or property of a workpiece, layer on a workpiece, feature or device on a workpiece, etc. that is reflective of the processing quality of the processing sequence. The measured data associated with an attribute is then used to adjust the process sequence by analyzing the measured data along with other in-situ processing data through the active interdiction control system. For example, the measured attribute data reflects non-conformities or defects on the workpiece for providing corrective processing.

FIG. 7A illustrates essentially a single measurement module 716. However, the particular common manufacturing platform 700 may incorporate a plurality of such measurement modules that are incorporated around one or more workpiece transfer systems, such as the workpiece transfer module 710. Such measurement modules 716 may be stand-alone modules that are accessed through the transfer module 710 like a processing module. Such stand-alone modules will generally incorporate inspection systems therein that are configured to engage a workpiece that is positioned in a measurement region of the module and to measure data associated with an attribute of the workpiece.

In an alternative embodiment of the invention, a measurement module might be implemented in a measurement region located within a dedicated area of an internal space of the transfer chamber defined by the transfer module 710. Still further, a measurement module might be incorporated wherein at least a portion of the measurement module is positioned inside of an internal space of a workpiece transfer module, and other components of the measurement module or the specific inspection system of the measurement module are incorporated outside of the workpiece transfer module and interfaced through an aperture or window into a dedicated area of the internal space that forms the measurement region in which a workpiece is located or through which a workpiece will pass.

The measurement modules of the inventive system and platform include one or more inspection systems that are operable for measuring data associated with an attribute of the workpiece. Such data may be associated with one or more attributes that reflect the quality of the processing sequence and the quality of the layers and features and devices that are being formed on a workpiece. The collected measurement data is then analyzed, along with processing module data, by an active interdiction control system for detecting various non-conformities and/or defects on the workpiece or workpiece layers/features. The system then provides for corrective processing of the workpiece, such as in upstream or downstream processing modules in the process sequence to ameliorate/correct the non-conformities or defects and improve the overall process.

In accordance with embodiments of the invention, the measurements taken by the measurement module or inspection systems thereof and the data generated is associated with one or more attributes of a workpiece. For example, the attribute measured may include, for example, on or more of: a layer thickness, a layer conformality, a layer coverage, a layer profile of a layer on the workpiece, an edge placement location, an edge placement error (EPE) for certain features, a critical dimension (CD), a block critical dimension (CD), a grid critical dimension (CD), a line width roughness (LWR), a line edge roughness (LER), a block LWR, a grid LWR, a property relating to selective deposition process(es), a property relating to selective etch process(es), a physical property, an optical property, an electrical property, a refractive index, a resistance, a current, a voltage, a temperature, a mass, a velocity, an acceleration, or some combination thereof associated with the fabricated electronic devices on the workpiece. The list of measured attributes for generating measurement data for the invention is not limited and could include other attribute data that might be used for processing a workpiece and fabricating devices.

As further discussed herein, the measurement modules and/or inspections systems used for providing attribute data may implement a number of tools and methods for measurement for providing the measurement and metrology of the invention. The measurement modules and/or inspections systems may include optical methods, or non-optical methods. Optical methods can include high-resolution optical imaging and microscopy (e.g., bright-field, dark-field, coherent/incoherent/partially coherent, polarized, Nomarski, etc.), hyperspectral (multi-spectral) imaging, interferometry (e.g., phase shifting, phase modulation, differential interference contrast, heterodyne, Fourier transform, frequency modulation, etc.), spectroscopy (e.g., optical emission, light absorption, various wavelength ranges, various spectral resolutions, etc.), Fourier transform Infrared spectroscopy (FTIR) reflectometry, scatterometry, spectroscopic ellipsometry, polarimetry, refractometers, etc. Non-optical methods can include electronic methods (e.g., RF, microwave, etc.), acoustic methods, photo-acoustic methods, mass spectroscopy, residual gas analyzers, scanning electron microscopy (SEM), transmission electron microscopy (TEM), atomic force microscopy (AFM), energy dispersive x-ray spectroscopy (EDS), x-ray photo-emission spectroscopy (XPS), etc. For example, the inspection system used for measuring data that is associated with an attribute of the workpiece may use one or more of the following techniques or devices: optical thin film measurement, such as reflectometry, interferometry, scatterometry, profilometry, ellipsometry; X-Ray measurements, such as X-ray photo-emission spectroscopy (XPS), X-Ray fluorescence (XRF), X-Ray diffraction (XRD), X-Ray reflectometry (XRR); ion scattering measurements, such as ion scattering spectroscopy, low energy ion scattering (LEIS) spectroscopy, auger electron spectroscopy, secondary ion mass spectroscopy, reflection absorption IR spectroscopy, electron beam inspection, particle inspection, particle counting devices and inspection, optical inspection, dopant concentration metrology, film resistivity metrology, such as a 4-point probe, eddy current measurements; a micro-balance, an accelerometer measurement, a voltage probe, a current probe, a temperature probe for thermal measurements, or a strain gauge. The list of measurement techniques or devices for generating measurement data for the invention is not limited and could include other techniques or devices that might be used for obtaining the useful data for processing a workpiece and fabricating devices in accordance with the invention.

The measurement modules and/or inspection systems may take measurements on various substrate or workpiece structures passed through the processing system including either product workpieces, or non-product substrates, i.e., a monitoring substrate. On product workpieces, measurements can be performed on designated target structures, both device-like structures and device-unlike structures, on specified device areas, or on arbitrary areas. The measurements may also be performed on test structures created on the workpiece, that might include pitch structures, area structures, density structures, etc.

Referring again to FIG. 7A, coupled to the transfer chamber 710 are a plurality of processing modules 720a-720d that are configured for processing substrates, such as semiconductor or silicon (Si) workpieces. The Si workpieces can, for example, have a diameter of 150 mm, 200 mm, 300 mm, 450 mm, or larger than 450 mm. The various processing modules and measurement modules all interface with the workpiece transfer module 710 through appropriate gate access ports with valves G, for example. According to one embodiment of the invention disclosed herein, the first processing module 720a might perform a treatment process on a workpiece, and the second processing module 720b might form a self-aligned monolayer (SAM) on a workpiece. The third processing module 720c may deposit a film on a workpiece by a suitable selective deposition process, and the fourth processing module 720d may selectively etch or clean a workpiece.

The transfer module 710 is configured for transferring workpieces between any of the processing modules 720a-720d and then into the metrology module 716 either before or after a particular processing step. FIG. 7A further shows the gate valves G that provide isolation at the access ports between adjacent processing chambers/tool components. As depicted in the embodiment of FIG. 7A, the processing modules 720a-720d and the metrology module 716 may be directly coupled to the transfer chamber 710 by the gate valves G and such direct coupling can greatly improve substrate throughput in accordance with the invention.

The common manufacturing platform 700 includes one or more controllers or control systems 722 that can be coupled to control the various processing modules and associated processing chambers/tools depicted in FIG. 7A during the integrated processing and measurement/metrology process as disclosed herein. The controller/control system 722 can be coupled to one or more additional controllers/computers/databases (not shown) as well. Control system 722 can obtain setup and/or configuration information from an additional controller/computer or a server over a network. The control system 722 is used to configure and run any or all of the processing modules and processing tools and to gather data from the various measurement modules and in-situ data from the processing modules to provide the active interdiction of the invention. The controller 722 collects, provides, processes, stores, and displays data from any or all of the processing modules and tool components. The control system 722, as described further herein, can comprise a number of different programs and applications and processing engines to analyze the measured data and in-situ processing data and to implement algorithms, such as deep learning networks, machine learning algorithms, autonomous learning algorithms and other algorithms for providing the active interdiction of the invention.

As described further herein, the active interdiction control system 722 can be implemented in one or more computer devices having a microprocessor, suitable memory, and digital I/O port and is capable of generating control signals and voltages that are sufficient to communicate, activate inputs to the various modules of the platform 700, and exchange information with the substrate processing systems run on the platform 700. The control system 722 monitors outputs from the processing system of the platform 700 as well as measured data from the various measurement modules of the platform to run the platform. For example, a program stored in the memory of the control system 722 may be utilized to activate the inputs to the various processing systems and transfer systems according to a process recipe or sequence in order to perform desired integrated workpiece processing.

The control system 722 also uses measured data as well as in-situ processing data output by the processing modules to detect non-conformities or defects in the workpiece and provide corrective processing. As discussed herein, the control system 722 may be implemented as a general-purpose computer system that performs a portion or all of the microprocessor-based processing steps of the invention in response to a processor executing one or more sequences of one or more instructions contained in a program in memory. Such instructions may be read into the control system memory from another computer readable medium, such as a hard disk or a removable media drive. One or more processors in a multi-processing arrangement may also be employed as the control system microprocessor element to execute the sequences of instructions contained in memory. In alternative embodiments, hard-wired circuitry may be used in place of or in combination with software instructions for implementing the invention. Thus, embodiments are not limited to any specific combination of hardware circuitry and software for executing the metrology driver processes of the invention as discussed herein.

The active interdiction control system 722 may be locally located relative to the platform 700, or it may be remotely located relative to the platform 700. For example, the controller 722 may exchange data with the platform 700 using at least one of a direct connection, an intranet connection, an Internet connection or a wireless connection. The control system 722 may be coupled to an intranet at, for example, a customer site (i.e., a device maker, etc.), or it may be coupled to an intranet at, for example, a vendor site (i.e., an equipment manufacturer). Additionally, for example, the control system 722 may be coupled to other systems or controls through an appropriate wired or wireless connection. Furthermore, another computer (i.e., controller, server, etc.) may access, for example, the control system 722 to exchange data via at least one of a direct wired connection or a wireless connection, such as an intranet connection, and/or an Internet connection. As also would be appreciated by those skilled in the art, the control system 722 will exchange data with the modules of the common manufacturing platform 700 via appropriate wired or wireless connections. The processing modules may have their own individual control systems (not shown) that take input data for control of the processing chambers and tools and subsystems of the modules and provide in-situ output data regarding the process parameters and metrics during the processing sequence.

Figure 7B:
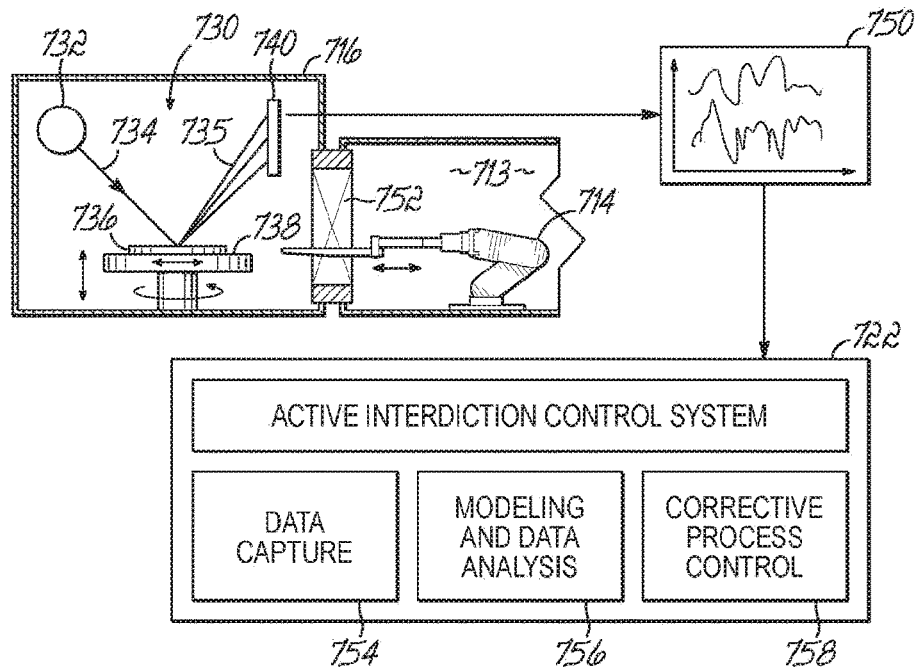
FIG. 7B is a side view in partial cross-section of a measurement module incorporated in the common manufacturing platform of FIG. 7A.

With specific reference to FIGS. 7A and 7B, and in accordance with one embodiment, measurement data may be obtained in a measurement/metrology module 716 that is a separate module on the platform 700 coupled to the transfer module 710. Generally, the transfer module 710 has a chamber that incorporates one or more transfer mechanisms or robots 714 that will handle and move workpieces through the internal space of the chamber and into and out of the processing module in the processing sequence.

More specifically, the transfer mechanism 714 is positioned inside of the internal space 713 of the transfer module 710 that can define a controlled environment and is configured for moving the workpieces through the internal space and environment and selectively in and out of the plurality of processing modules 720a-720d and the measurement modules 716 or into and out of a measurement region in a dedicated area of the internal space in order for a measurement inspection system to measure data. In accordance with one feature of the invention, because the internal space 713 of the transfer module 710 and processing modules 720a-720d and measurement modules 716 are coupled together on the common manufacturing platform 700, the controlled environment may be maintained for the workpiece generally through most of or all of the measurement and processing sequence. Such a controlled environment could involve a vacuum environment or an inert gas atmosphere in the transfer module or measurement module.

Figure 7C:
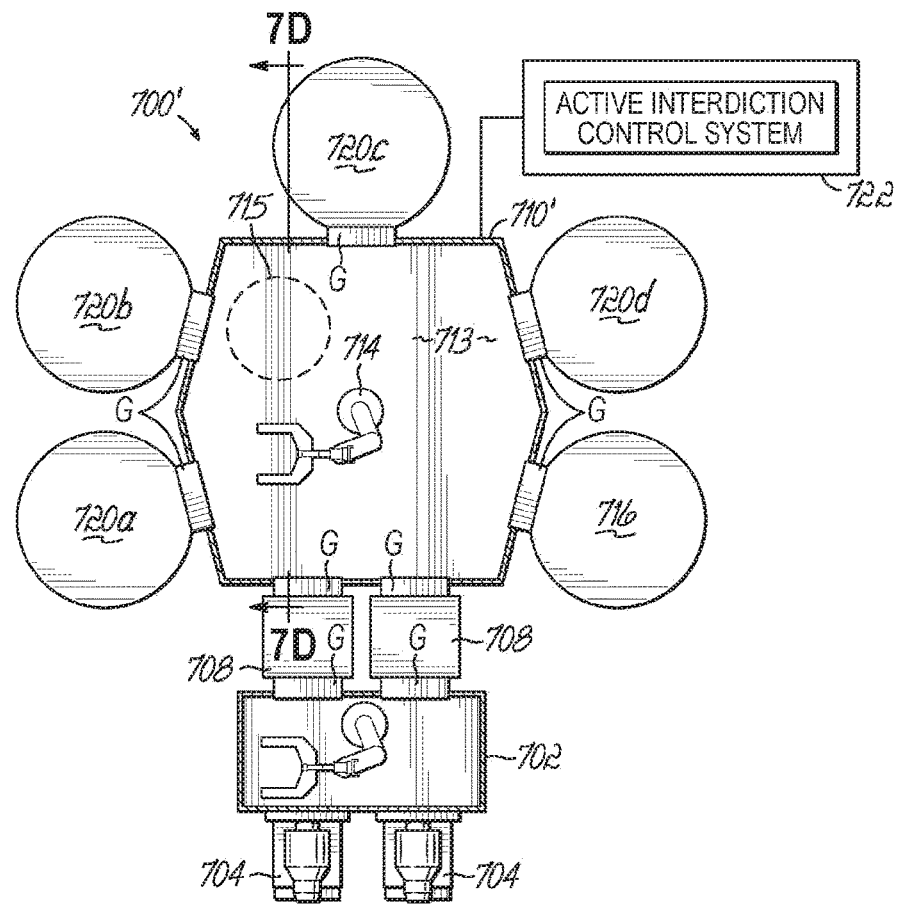
FIG. 7C is a schematic diagram illustrating in top view another embodiment of a common manufacturing platform for performing an integrated sequence of processing steps.
Figure 7D:
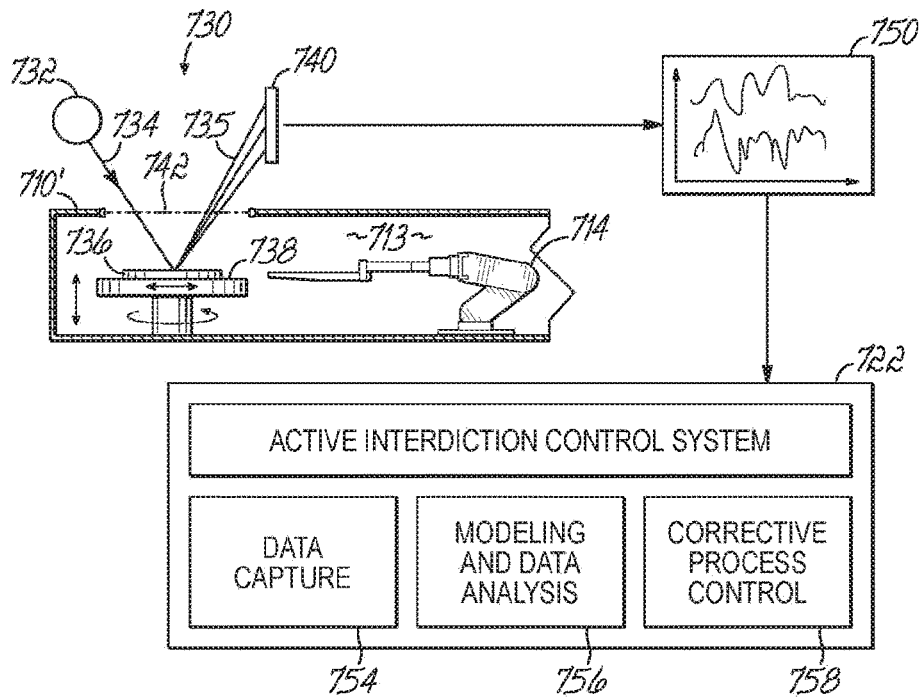
FIG. 7D is a side view in partial cross-section of a measurement module incorporated in the common manufacturing platform of FIG. 7C.

The transfer module 710 includes a plurality of access ports or side ports, each with a suitable gate G, through which a workpiece is moved to and from the plurality of processing modules 720a-720d. To provide the necessary processing sequence for efficient through-put on platform 700, the plurality of processing modules 720a-720d includes modules that handle a variety of workpiece processing steps on the common platform, including one or more etching modules and one or more film-forming or deposition modules. The measurement module 716, as illustrated in FIG. 7A is coupled with the transfer module 710 also at one of the side or access ports through a suitable gate G. In other embodiments, the measurement module is coupled with the transfer module at a port formed in the top of the transfer module. In still further embodiments as described herein, the transfer module acts as a measurement module as well wherein at least a portion of the measurement module for capturing measurement data is incorporated or positioned inside of an internal space of the transfer module. The transfer measurement module (TMM) in such an embodiment, as illustrated in FIGS. 7C-7D, includes a measurement region located within a dedicated area of the internal space of the transfer module.

The active interdiction control system 722 collects workpiece measurement data generally on-the-fly as the substrate moves in the processing sequence between one or more of the processing modules and the measurement/metrology module 716. The data is captured and then analyzed and processed to detect non-conformities and defects and provide corrective processing as discussed herein. The active interdiction control system 722 provides the necessary control of the processing steps of the sequence to make control adjustments to various fabrication processing steps as performed in order to correct for the detected non-conformities/defects. Adjustments may be made to process steps and processing modules that precede or are upstream of the captured measurement data and/or process steps that follow or are downstream of the measurement data in sequence. Alternatively, a suitable corrective action or corrective processing might include ejection of the workpiece from the platform 700 in order to not waste further time and materials on a workpiece which cannot be saved.

Referring to FIG. 7B, one exemplary measurement module 716 is illustrated that incorporates an inspection system 730 for making measurements on the workpiece within the controlled environment with respect to the processing sequence executed on common manufacturing platform 700.

The inspection system 730 measures data associated with an attribute of the workpiece, as discussed herein. The inspection system 730 incorporates one or more signal sources 732 that direct a measurement signal 734 toward a workpiece 736. Incident signals 734 are reflected or scattered from the surface of the workpiece 736 and the scattered signals 735 are captured by the detector 740. The detectors 740 generate measurement data 750 which may then be directed to the active interdiction control system 722 as described herein. In one embodiment, the workpiece 736 is positioned by transfer mechanism 714 on a measurement platform 738 that may be translated side-to-side and up and down and rotated as indicated by the arrows in FIG. 7B so that a measurement signal 734 may be directed to various proper positions on the workpiece 736.

That is, in the embodiment of FIG. 7B, the measurement module includes a separate support mechanism 738 for supporting a workpiece 736 positioned in the measurement module 716. The inspection system engages the support mechanism 738 for measuring data associated with a workpiece attribute supported on the support mechanism. In such a scenario, the support mechanism 738 in the measurement module 716 is generally separate from the transfer mechanism that otherwise moves the workpiece 736 and positions it on the support mechanism.

The separate support mechanism translates the workpiece 736, such as through vertical and/or horizontal movement and also may rotate the workpiece 736 to provide at least two degrees of freedom for measuring data associated with an attribute of the workpiece 736 as discussed herein. The support mechanism may also incorporate a temperature control element therein for controlling workpiece temperature. Therefore, in the embodiment of FIG. 7B, the support mechanism provides the support and movement of the workpiece 736 necessary for the measurement of data after the workpiece 736 is positioned thereon by the transfer mechanism. In an alternative embodiment, the transfer mechanism may provide the function of supporting and moving the workpiece 736 for engagement with the inspection system 730 for measuring data associated with an attribute on the workpiece 736.

The captured measurement data 750 may then be directed to control system 722 and further evaluated and analyzed to determine a particular action for the measured workpiece. If the measurement data indicates that the measured parameters are within specification of the desired design and fabrication process, and/or there are no actionable detected defects, the workpiece may proceed as normal through the process flow within the platform 700. Alternatively, if the measured data 750 indicates that the workpiece is beyond correction or amelioration, the workpiece might be ejected from further processing. Alternatively, in accordance with an embodiment of the invention, the active interdiction control system 722 may analyze the data and provide corrective processing as one or more corrective steps to be taken for that workpiece or to be made in various process steps of the overall process flow in order to correct the current workpiece, and also to prevent the need for corrective action in other workpieces that are subsequently processed on the platform 700. Specifically, referring to FIG. 7B, the active interdiction control system 722 may incorporate one or more processing steps and processing components therein for yielding correction to the process flow. First, the necessary measurement data 750 may be captured and pre-processed as illustrated by block 754. Next, modeling and data analysis occurs on the captured data as well as any in-situ processing data associated with one or more of the processing modules and process steps as indicated by block 756. The modeling and analysis may utilize artificial intelligence, including deep learning and autonomous learning programs and components. Next, the analysis may provide corrective process control wherein one or more of the processing steps and processing modules are controlled to correct or ameliorate perceived or detected non-conformities or defects in the layers and features that are out of specification with respect to the overall design for the workpiece fabrication. The corrective process control of block 758 may be provided to one or more of the processing steps or processing modules and it may be applied to one or more processing steps that are previous in time (upstream) to the capture of the measurement data 750 or may be applied to one or more of the process steps to follow (downstream) the capture of the measurement data 750 within the overall substrate fabrication according to the desirable design. The active interdiction control system 722, and its processes as indicated by blocks 754, 756 and 758 may be incorporated in software run by one or more computers of the control system 722 and/or components of that system.

In accordance with embodiments of the invention, the inspection systems for obtaining measurement data engage the workpiece by performing contact measurement or metrology or non-contact measurement or metrology depending on the attribute measured or the type of measurement. A combination of both contact and non-contact measurement might be used. Depending on the location of the inspection system, portions of the inspection system may be positioned partially or entirely inside an internal space or chamber of a module. In the embodiment of FIG. 7A as disclosed herein, dedicated measurement modules 716 may entirely contain the inspection system. Alternatively, a portion of a measurement module might be positioned inside of an internal space of a chamber, such as inside an internal space of a workpiece transfer module, with another portion of the measurement module located outside of the chamber. Such an embodiment is illustrated in FIG. 7D for example wherein a transfer measurement module is illustrated using a measurement region located within a dedicated area of the transfer chamber internal space and the inspection system is configured for engaging a workpiece positioned in the measurement region for measuring data associated with an attribute on the workpiece.

Support mechanism 738 or transfer mechanism 714 holding workpiece 736 may be translated and rotated to provide measurements of various areas on the workpiece 736. In that way, measurement data may be captured at various portions or segments of the entire workpiece. Thus, continuous measurements or point-by-point measurements are possible thereby reducing the overall measurement time and processing time.

For example, the inspection system measures data over a portion of the workpiece that is equal to or exceeding 1 square centimeter. Alternatively, the inspection system measures or images a substantive portion of the workpiece that is equal to or exceeding 90% of the working surface area of the workpiece. As noted, the inspection system may perform a measurement at plural discrete locations on the working surface of the workpiece or may perform a continuous sequence of measurements across a portion of the workpiece. For example, the inspection system may perform a measurement along a path extending across or partially across the workpiece. Such a path may include a line, a sequence of lines, an arc, a circular curve, a spiral curve, an Archimedean spiral, a logarithmic spiral, a golden spiral, or some combination thereof. Also, there may be several inspection systems wherein source/detector pairs 732, 740 may each represent a different inspection signal from a different inspection system and may be different forms of signals. For example, one source/detector pair 732, 740 might use an optical signal while another source/detector pair 732, 740 might use an electromagnetic signal, depending on the inspection system.

The inspection system(s) can perform multiple measurements of attributes on a workpiece while the workpiece is in a measurement module or in dedicated area of a transfer measurement module as discussed herein. The measurements may be made simultaneously in time. That is, different inspection systems might make measurements at the same time. Alternatively, the various inspection systems might operate at different times. For example, it may be necessary to move or position the workpiece in one position for one type of measurement or inspection system, and then move or position the workpiece for another measurement by the same or a different type of inspection system.

The inspection system(s) may be non-contact systems for providing non-contact measurement and metrology. Alternatively, one or more inspection systems of a measurement module or transfer measurement module might use a contact sensor that may be moved and positioned at a surface of the workpiece to make a measurement. The inspection systems provided in accordance with the invention may incorporate a combination of contact inspection systems and non-contact inspection systems for gathering measurement data associated with an attribute of the workpiece.

As described above, the inspection system as implemented in a measurement module or in a transfer measurement module may be stationary while the support mechanism or workpiece transfer mechanism moves the workpiece to engage with the inspection system and to take measurements in different areas of the workpiece. Alternatively, the inspection system 730, or some portion thereof, is movable with respect to the workpiece support mechanism 738, the workpiece transfer mechanism 714 and the module. The inspection system might be configured to translate and/or rotate with respect to the stationary workpiece to obtain measurement data from areas of the workpiece.

In other embodiments of the invention, the inspection system may be embedded in or part of a workpiece support mechanism. The inspection system 730 might be mounted or supported on the support mechanism 738. Then, when the workpiece is positioned on the support mechanism, it will be in a proper position for engagement by the inspection system. An inspection system 730 might be embedded in the support mechanism so as to sit below or otherwise proximate to a positioned workpiece to provide measurement data associated with a mass measurement or a temperature measurement of the workpiece, for example.

FIG. 7C illustrates a common manufacturing platform 700' incorporating a transfer module 710' in accordance with one embodiment the invention that utilizes a dedicated area to form a measurement region wherein measurement data may be gathered from a workpiece during transit. In that way, as noted herein, the workpiece can be processed and measured while remaining within a controlled environment, such as a vacuum environment. The workpiece does not need to leave the environment of the platform 700' for determining how the process is proceeding and for detecting any non-conformities or defects. Accordingly, the embodiment as illustrated in FIG. 7CA forms a transfer measurement module (TMM) that may be utilized with one or more processing modules or as part of a common manufacturing platform. Furthermore, multiple transfer measurement modules may be utilized and interfaced together to cooperate and form a larger common manufacturing platform.

The inspection systems incorporated within a transfer measurement module (TMM) operate in and are similar to other inspection systems as described herein. Such inspection systems as illustrated in FIG. 7D, for example, only illustrate certain inspection systems. However, other inspection systems and features, such as those discussed above, would also be applicable to the transfer mechanism module is illustrated in FIG. 7C. As such, some common reference numerals are utilized in FIGS. 7C-7D as previously discussed herein.

The platform 700' incorporates a workpiece transfer module 710' that provides measurement/metrology data. The transfer measurement module (TMM) 710' includes a workpiece transfer mechanism, such as in the form of a handling robot 714 within the internal space of a transfer chamber 713. The transfer mechanism 714 is operable as in platform 700 to move one or more or more workpieces through the transfer module 710' and between various of the processing modules that are coupled to transfer module 710' in the common manufacturing platform. In accordance with one feature of the invention, transfer chamber 713 defines an internal space that includes a dedicated area that is used for measurement. The measurement region 715 of the TMM 710' is located in the dedicated area. The measurement region/area 715 is proximate to one or more inspection systems 730 for measurement.

More specifically, the measurement region 715 is positioned within the transfer chamber 713 so as to not interfere with the primary purpose of the transfer measurement module in moving workpieces through the process sequence and into and out of various processing modules. The measurement region defines one or more positions for placement of a workpiece for measurement. To that end, one or more inspection systems are configured to engage a workpiece that is positioned in the measurement region of the transfer chamber 713. The inspection system is then operable for measuring data associated with an attribute on the workpiece in accordance with the invention. As noted with the inspection systems disclosed herein, a support mechanism might be located within the measurement region 715 for supporting a workpiece during the collection of measurement data by the inspection system. Alternatively, the transfer mechanism 714 may provide the positioning and support of the workpiece within the measurement region 715 of the transfer chamber. In accordance with embodiments of the invention, the workpiece can be moved into or through the measurement region 715 during a processing sequence to obtain measurement data from one or more inspection systems that are associated with that measurement region. While a single measurement region is illustrated in FIG. 7C for illustrative purposes, multiple measurement regions 715 might be incorporated into the TMM 710'.

Referring to FIG. 7D, the TMM module 710' incorporates one or more inspection systems 730 located within a measurement region 715 and provides the ability to obtain real-time measurements and measurement data during a processing sequence. In one embodiment, measurement region 715 within the TMM 710' incorporates a support mechanism 738 that receives a workpiece from mechanism 714 for measurement inside chamber 713. Measurement data is captured as the workpiece is moved between processing modules. As discussed above, alternatively, the transfer mechanism or robot 714 might actually act as a support mechanism for moving the workpiece with respect to the inspection system 730 in the TMM 710'. Still further, the inspection system 730 in the TMM 710' might also incorporate a stationary workpiece wherein the inspection system 730 itself moves. Similarly, the inspection system 730 might be incorporated as part of or embedded with the support mechanism.

The measurement module or inspection system 730 may be entirely contained in the TMM 710' to make measurements. In other embodiments, a least a portion of the measurement module or inspection system is positioned inside of an internal space of the TMM 710' so as to define a measurement region within a dedicated area of the internal space as shown in FIG. 7D, while other portions may reside outside the TMM 710'. More specifically, measurement region 715 is defined and is located within a dedicated area of the internal space of the transfer chamber 713. The signal source and signal detector elements of inspection system 730 may be located externally of the transfer chamber internal space 713 while the workpiece support mechanism 738 and transfer mechanism 714 for supporting a workpiece 736 are contained within the transfer chamber 713. To that end, the inspection signals 734 pass through an appropriate access port 742 that is effectively transparent to the passage of the inspection signal 734 from the inspection system 730 and into the internal space 713 to engage workpiece 736 positioned in the measurement region 715. As noted, the inspection signal 734 might include an electromagnetic signal, an optical signal, a particle beam, a charged particle beam, or some combination of such signals. The access port 742 may be appropriately formed to operate with a specific inspection system and the sources of the inspection signal. For example, the access port 742 might include a window, an opening, a valve, a shutter, and iris, or some combination of different structures for forming the access port in order to allow incident inspection signals to engage the workpiece 736. To that end, at least a portion of the inspection system 730 might be located generally above a top surface of the transfer chamber 713.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method of forming a gate contact on a semiconductor workpiece using an integrated sequence of processing steps executed on a common manufacturing platform hosting a plurality of processing modules including one or more film-forming modules, one or more etching modules, and one or more transfer modules, the integrated sequence of processing steps comprising:
   receiving a workpiece into the common manufacturing platform, the workpiece having a contact feature formed therein, the contact feature having a semiconductor contact surface exposed at a bottom of the contact feature, the semiconductor contact surface containing silicon, or germanium, or an alloy thereof;
   treating the semiconductor contact surface in one of the one or more etching modules to remove contamination therefrom;
   depositing a plurality of metal layers at a bottom of the contact feature using one or more film-forming modules;
   forming a metal silicide and/or germanide layer by reaction of at least a portion of the deposited metal layer with the semiconductor contact surface; and
   inspecting the workpiece before and/or after any one of the treating, depositing, applying, and forming steps to measure one or more attributes of the workpiece, determine whether the measured one or more attributes meet target specifications, and when an excursion from target specifications occurs, take corrective action before, during, or after any one of the integrated sequence of processing steps,
   wherein the integrated sequence of processing steps is executed in a controlled environment within the common manufacturing platform and without leaving the controlled environment, and wherein the one or more transfer modules are used to transfer the workpiece between a plurality of processing modules while maintaining the workpiece within the controlled environment.

2. The method of claim 1, wherein depositing the metal layer comprises:
   applying a self-assembled monolayer on an adjacent topography to the contact feature and on sidewall surfaces of the contact feature;
   selectively depositing the metal layer on the semiconductor contact surface at the bottom of the contact feature; and
   removing the self-assembled monolayer exposed on the adjacent topography and sidewall surfaces.

3. The method of claim 1, further comprising, during the integrated sequence of processing steps:
treating the semiconductor contact surface in one of the one or more etching modules to remove any metal layer that did not form onto the metal silicide.

4. The method of claim 1, wherein the one or more transfer modules further include a workpiece measurement region located within a dedicated area of at least one of the one or more transfer modules, the integrated sequence of processing steps further comprising:
during at least one of the transfers of the workpiece between the plurality of processing modules, passing the workpiece into the workpiece measurement region and obtaining measurement data related to one or more attributes of the workpiece.

5. The method of claim 4, wherein the one or more attributes include:
attributes of the contact feature or the adjacent topography, or both, as received into the common manufacturing platform;
attributes of the contact feature or the adjacent topography after the etching;
attributes of the self-assembled monolayer prior to selectively depositing the metal layer;
attributes of one or more of the self-assembled monolayer, the metal layer, the contact feature, or the adjacent topography after selectively depositing the metal layer;
attributes of the metal layer, the contact feature or the adjacent topography after removing the self-assembled monolayer; attributes of the conductive capping layer, the contact feature, or the adjacent topography after the applying; or
attributes of the metal silicide layer.

6. The method of claim 4, wherein obtaining measurement data includes measuring a degree of oxidation of the silicon-containing surface on the workpiece as received into the common manufacturing platform.

7. The method of claim 6, wherein the corrective actions comprise comprises adjusting one or more process parameters of the etching if the measurement data obtained indicates a deviation from one or more target values for dimensions or the degree of oxidation.

8. The method of claim 4, wherein obtaining measurement data includes measuring contact feature dimensions or a degree of oxidation of the silicon-containing surface after the etching and prior to depositing the metal layer.

9. The method of claim 8, wherein the corrective actions comprise etching the workpiece again when the measurement data obtained after the etching and prior to depositing the metal layer indicates a deviation from one or more target values for the dimensions or the degree of oxidation.

10. The method of claim 4, wherein obtaining measurement data includes measuring the self-assembled monolayer prior to selectively depositing the metal layer and/or measuring thickness of the metal layer at the bottom of the contact feature prior to applying the conductive capping layer.

11. The method of claim 10, wherein the corrective actions comprise:
removing the self-assembled monolayer on the workpiece when the measurement data indicates a deviation from one or more target values for thickness and/or density of the self-assembled monolayer; and
applying another self-assembled monolayer on the workpiece after the removing.

12. The method of claim 10, wherein the corrective actions comprise:
applying another self-assembled monolayer on the workpiece when the measurement data indicates a deviation from one or more target values for thickness and/or density of the self-assembled monolayer.

13. The method of claim 10, wherein the corrective actions comprise:
depositing another metal layer when the measurement data indicates the thickness of the metal layer is less than a target value for metal layer thickness; or
removing a portion of the metal layer when the measurement data indicates the thickness of the metal layer is higher than a target value for metal layer thickness.

14. A method of forming a gate contact on a semiconductor workpiece using an integrated sequence of processing steps executed on a common manufacturing platform hosting a plurality of processing modules including a plurality of film-forming modules, a plurality of etching modules, and one or more transfer modules, the integrated sequence of processing steps comprising:
receiving a workpiece into the common manufacturing platform, the workpiece having a contact feature formed therein, the contact feature having a semiconductor contact surface exposed at a bottom of the contact feature, the semiconductor contact surface containing silicon, or germanium, or an alloy thereof;
treating the semiconductor contact surface in a first one of the plurality of etching modules to remove contamination therefrom;
applying a self-assembled monolayer on an adjacent topography to the contact feature and on sidewall surfaces of the contact feature in a first one of the plurality of film-forming modules;
selectively depositing a metal layer on the semiconductor contact surface at the bottom of the contact feature in a second one of the plurality of film-forming modules;
removing the self-assembled monolayer exposed on the adjacent topography and sidewall surfaces in a second one of the plurality of etching modules; and
forming a metal silicide and/or germanide layer by reaction of at least a portion of the metal layer with silicon and/or germanium in the semiconductor contact surface,
wherein the integrated sequence of processing steps is executed in a controlled environment within the common manufacturing platform and without leaving the controlled environment, and wherein the one or more transfer modules are used to transfer the workpiece between the plurality of processing modules while maintaining the workpiece within the controlled environment.

15. The method of claim 14, further comprising, during the integrated sequence of processing steps:
treating the semiconductor contact surface in a third one of the plurality of etching modules to remove any metal layer that did not react with the silicon and/or germanium.

16. A manufacturing platform for performing a gate contact process on a workpiece, the platform comprising:
one or more film-forming modules;
one or more etching modules;
at least one transfer module to which one or more film-forming modules and the one or more etching modules are mounted; and
a control system programmably configured to transfer a workpiece between the one or more film-forming modules and the one or more etching modules, while using the at least one transfer module to maintain a controlled environment, and operate the platform to fill a recessed contact feature while avoiding contact oxidation during the filling of the recessed contact feature.

17. The manufacturing platform of claim 16, further comprising one or more annealing modules.

18. A method of forming a gate contact on a semiconductor workpiece using an integrated sequence of processing steps executed on a common manufacturing platform hosting a plurality of processing modules including a plurality of film-forming modules, a plurality of etching modules, and one or more transfer modules, the integrated sequence of processing steps comprising:
- receiving a workpiece into the common manufacturing platform, the workpiece having a contact dielectric film and a mask for forming a contact feature in the contract dielectric film;
- etching the contact feature in the contact dielectric film to expose a semiconductor contact surface in a first one of the plurality of etching modules, the semiconductor contact surface containing silicon, or germanium, or an alloy thereof;
- treating the contact feature, following the etching, to remove post-etch residue in a second one of the plurality of etching modules;
- applying a self-assembled monolayer on an adjacent topography to the contact feature and on sidewall surfaces of the contact feature in a first one of the plurality of film-forming modules;
- selectively depositing a metal layer on the bottom of the contact feature in a second one of the plurality of film-forming modules;
- removing the self-assembled monolayer exposed to the adjacent topography and sidewall surfaces in a third one of the plurality of etching modules; and
- forming a metal silicide and/or germanide layer by reaction of at least a portion of the metal layer with silicon and/or germanium in the semiconductor contact surface,
- wherein the integrated sequence of processing steps is executed in a controlled environment within the common manufacturing platform and without leaving the controlled environment, and wherein the one or more transfer modules are used to transfer the workpiece between the plurality of processing modules while maintaining the workpiece within the controlled environment.

19. The method of claim 18, further comprising:
- treating the contact feature to remove any metal layer that did not react with silicon and/or germanium in the semiconductor contact surface.

* * * * *